United States Patent
Koezuka et al.

(10) Patent No.: US 9,287,407 B2
(45) Date of Patent: Mar. 15, 2016

(54) MANUFACTURING METHOD OF SEMICONDUCTOR DEVICE

(75) Inventors: Junichi Koezuka, Tochigi (JP); Shinji Ohno, Atsugi (JP); Yuichi Sato, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 269 days.

(21) Appl. No.: 13/484,670

(22) Filed: May 31, 2012

(65) Prior Publication Data

US 2012/0315730 A1    Dec. 13, 2012

(30) Foreign Application Priority Data

Jun. 10, 2011 (JP) ................. 2011-129976

(51) Int. Cl.
H01L 21/22 (2006.01)
H01L 29/786 (2006.01)
H01L 29/66 (2006.01)

(52) U.S. Cl.
CPC ...... *H01L 29/7869* (2013.01); *H01L 29/66969* (2013.01); *H01L 29/78618* (2013.01)

(58) Field of Classification Search
CPC ... H01L 21/22; H01L 21/225; H01L 21/2251; H01L 21/2253; H01L 29/7869
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,160,268 | A * | 12/2000 | Yamazaki ........... 257/57 |
| 6,294,274 | B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

(Continued)

*Primary Examiner* — Jae Lee
(74) *Attorney, Agent, or Firm* — Eric J. Robinson; Robinson Intellectual Property Law Office, P.C.

(57) ABSTRACT

A transistor using an oxide semiconductor, which has good on-state characteristics is provided. A high-performance semiconductor device including the transistor capable of high-speed response and high-speed operation is provided. The transistor includes the oxide semiconductor film including a channel formation region and low-resistance regions in which a metal element and a dopant are included. The channel formation region is positioned between the low-resistance regions in the channel length direction. In a manufacturing method of the transistor, the metal element is added by heat treatment performed in the state where the oxide semiconductor film is in contact with a film including the metal element and the dopant is added through the film including the metal element by an implantation method so that the low resistance regions in which a metal element and a dopant are included are formed.

11 Claims, 13 Drawing Sheets

(56) References Cited

U.S. PATENT DOCUMENTS

| | | | |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,003,981 | B2 | 8/2011 | Iwasaki et al. |
| 8,164,090 | B2 | 4/2012 | Iwasaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2003/0219921 | A1* | 11/2003 | Biard et al. .............. 438/38 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0133525 | A1* | 6/2010 | Arai et al. .............. 257/40 |
| 2011/0240998 | A1* | 10/2011 | Morosawa ........ H01L 29/41733 257/57 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| WO | WO-2004/114391 | | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.O et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2002, vol. 85, No. 5, pp. 1012-1015.

Fung.T et al., "2-D Numerical Simulation of High Performance Amorphous In—Ga—Zn—O TFTs for Flat Panel Displays,", AM-FPD, '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Pepers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga13 Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3-A2O3-BO Systems[A; Fe, Ga, Or Al; B: Mg, Mn, Fe, Ni, Cu,Or Zn]at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Pepers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review, B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

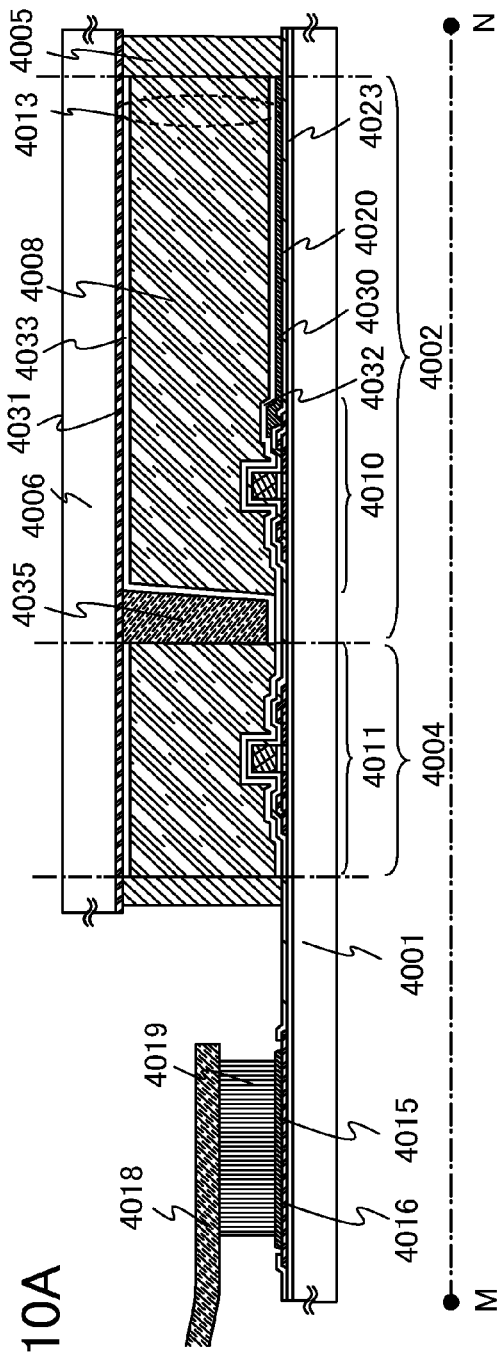

MANUFACTURING METHOD OF SEMICONDUCTOR DEVICE

BACKGROUND OF THE INVENTION

1. Field of the Invention

The present invention relates to a semiconductor device and a method for manufacturing the semiconductor device.

In this specification, the semiconductor device generally means any device which can function by utilizing semiconductor characteristics, and an electrooptic device, a semiconductor circuit, and electronic equipment are all included in the category of the semiconductor device.

2. Description of the Related Art

Attention has been focused on a technique for forming a transistor with use of a semiconductor thin film formed over a substrate having an insulating surface (the transistor also referred to as a thin film transistor (TFT)). The transistor has been applied to a wide range of electronic devices such as an integrated circuit (IC) or an image display device (display device). A silicon semiconductor material is widely known as a material for a semiconductor thin film applicable to a transistor. As another material, an oxide semiconductor has attracted attention.

As for the transistor using an oxide semiconductor, better electric characteristics has been required for application to semiconductor devices with higher performance. To realize good electric characteristics of a transistor using an oxide semiconductor, for example, a technology in which a low-resistance source and drain regions are formed by using an aluminum reaction method has been reported (e.g., see Non-Patent Document 1).

REFERENCE

Non-Patent Document 1: N. Morosawa. et al. SID 11 DIGEST pp. 479-482

SUMMARY OF THE INVENTION

An improvement in the on-state characteristics (e.g., on-state current and field-effect mobility) of a transistor using an oxide semiconductor leads to high-speed response and high-speed operation of a semiconductor device; thus, a semiconductor device with higher performance can be achieved.

In view of the above, an object of one embodiment of the present invention is to provide a transistor using an oxide semiconductor, which has good on-state characteristics.

Further, an object of one embodiment of the present invention is to provide a high-performance semiconductor device including a transistor capable of high-speed response and high-speed operation.

In a manufacturing method of a transistor including an oxide semiconductor film including a channel formation region, low-resistance regions in which a metal element added by heat treatment performed in the state where the oxide semiconductor film is in contact with a film including the metal element and a dopant added through the film including the metal element by an implantation method are included are formed in the oxide semiconductor film. The channel formation region is positioned between the low-resistance regions in the channel length direction.

A metal film, a metal oxide film, a metal nitride film, and the like are given as examples of the film including the metal element.

As the metal element included in the film including the metal element, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used. As the film including the metal element, a metal film, a metal oxide film, or a metal nitride film including at least one of the above-described metal elements (such a metal nitride film is, for example, a titanium nitride film, a molybdenum nitride film, or a tungsten nitride film) can be used. Further, a dopant such as phosphorus (P) or boron (B) may be included in the film including the metal element.

The film including the metal element is formed in contact with the oxide semiconductor film, in which state heat treatment is performed; accordingly, the metal element can be added to the oxide semiconductor film from the film including the metal element. The heat treatment is preferably performed under an oxygen atmosphere. The heat treatment can also be performed under reduced pressure or a nitrogen atmosphere. The heating temperature may be set to be higher than or equal to 100° C. and lower than or equal to 700° C., preferably higher than or equal to 200° C. and lower than or equal to 400° C. In the case where a film which includes a metal element and has electrical conductivity is used as the film including the metal element, the heat treatment for adding the metal element from the film including the metal element to the oxide semiconductor film makes the film including the metal element an insulating film including a metal element. For example, a metal film is made to be a metal oxide film or a metal nitride film by the heat treatment for adding the metal element from the film including the metal element to the oxide semiconductor film, and the metal oxide film or the metal nitride film can be used as an insulating film when the film has an insulation property.

The dopant is an impurity by which the electrical conductivity of the oxide semiconductor film is changed. One or more selected from the following can be used as the dopant: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant may be included in the film including the metal element.

The dopant is added to the oxide semiconductor film through the film including the metal element (a metal film, a metal oxide film, or a metal nitride film) by the implantation method. As the method for adding the dopant, an ion implantation method, an ion doping method, a plasma immersion ion implantation method, or the like can be used. In that case, it is preferable to use a single ion of the dopant or a hydride ion, a fluoride ion, or a chloride ion thereof.

The concentration of the dopant in the low-resistance region is preferably greater than or equal to $5\times10^{18}$ atoms/cm$^3$ and less than or equal to $1\times10^{22}$ atoms/cm$^3$.

Heat treatment may be performed thereon after the dopant addition. The heat treatment may also serve as the heat treatment for adding the metal element from the film including the metal element.

In the manufacturing process, the order of the step of addition of the metal element from the film including the metal element by the heat treatment and the step of addition of the dopant by the implantation method is not limited; either one is precedence. Further, any of these steps may be conducted plural times.

For example, in the case where a metal film is used as the film including the metal element and the metal element is added to the oxide semiconductor film by heat treatment under an oxygen atmosphere, a dopant passes through the metal film when the dopant is added before the heat treatment or alternatively comes to pass through a metal oxide film when the dopant is added after the heat treatment.

With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

Thus, by using the transistor whose electric characteristics are good, a high-performance, highly reliable semiconductor device can be provided.

One embodiment of the present invention disclosed in this specification is a method for manufacturing a semiconductor device, in which an oxide semiconductor film including a channel formation region is formed, and low-resistance regions whose resistance is lower than that of the channel formation region and which include a metal element and a dopant are formed in the oxide semiconductor film so as to sandwich the channel formation region. The low-resistance region is formed by two steps: a step of forming a film including the metal element to be in contact with the oxide semiconductor film and performing heat treatment in the state where the oxide semiconductor film is in contact with the film including the metal element, so that the metal element is added to the oxide semiconductor film from the film including the metal element; and a step of adding the dopant to the oxide semiconductor film through the film including the metal element.

One embodiment of the present invention disclosed in this specification is a method for manufacturing a semiconductor device, in which an oxide semiconductor film including a channel formation region is formed; a stack of a gate insulating film and a gate electrode layer is selectively formed over the oxide semiconductor film so as to overlap with the channel formation region; a film including a metal element is formed in contact with part of the oxide semiconductor film over the oxide semiconductor film, the gate insulating film, and the gate electrode layer; a dopant is selectively added to the oxide semiconductor film through the film including the metal element with the gate insulating film and the gate electrode layer used as a mask; and the metal element is added to the oxide semiconductor film from the film including the metal element by heating the doped oxide semiconductor film and the film including the metal element, so that low-resistance regions whose resistance is lower than that of the channel formation region and which include the metal element and the dopant are formed in the oxide semiconductor film so as to sandwich the channel formation region.

One embodiment of the present invention disclosed in this specification is a method for manufacturing a semiconductor device, in which an oxide semiconductor film including a channel formation region is formed; a stack of a gate insulating film and a gate electrode layer is selectively formed over the oxide semiconductor film so as to overlap with the channel formation region; a film including a metal element is formed in contact with part of the oxide semiconductor film over the oxide semiconductor film, the gate insulating film, and the gate electrode layer; the metal element is added to the oxide semiconductor film from the film including the metal element by heating the oxide semiconductor film and the film including the metal element; and a dopant is selectively added to the oxide semiconductor film after being added with the metal element, through the film including the metal element with the gate insulating film and the gate electrode layer used as a mask, so that low-resistance regions whose resistance is lower than that of the channel formation region and which include the metal element and the dopant are formed in the oxide semiconductor film so as to sandwich the channel formation region.

In the above structure, heat treatment (dehydration or dehydrogenation treatment) by which hydrogen or moisture is eliminated from the oxide semiconductor film may be performed on the oxide semiconductor film before the film including the metal element is formed.

The dehydration or dehydrogenation treatment may accompany elimination of oxygen which is a main constituent material of an oxide semiconductor to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy.

Thus, oxygen is preferably supplied to the oxide semiconductor film after being subjected to the dehydration or dehydrogenation treatment. By supply of oxygen to the oxide semiconductor film, oxygen vacancies in the film can be repaired.

For example, an oxide insulating film including much (excessive) oxygen, which serves as a supply source of oxygen, may be provided so as to be in contact with the oxide semiconductor film, whereby oxygen can be supplied from the oxide insulating film to the oxide semiconductor film. In the above structure, heat treatment may be performed in the state where the oxide semiconductor film after being subjected to the heat treatment and the oxide insulating film are in contact with each other at least partly to supply oxygen to the oxide semiconductor film.

Further or alternatively, oxygen (which includes at least one of an oxygen radical, an oxygen atom, and an oxygen ion) may be added to the oxide semiconductor film after being subjected to the dehydration or dehydrogenation treatment to supply oxygen to the oxide semiconductor film. As the method for addition of oxygen, an ion implantation method, an ion doping method, a plasma immersion ion implantation method, plasma treatment, or the like can be used.

Further, it is preferable that the oxide semiconductor film in the transistor include a region where the oxygen content is higher than that in the stoichiometric composition ratio of the oxide semiconductor in a crystalline state. In that case, the oxygen content is higher than that in the stoichiometric composition ratio of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. Accordingly, the Fermi level (Ef) of the oxide semiconductor can be changed to the same level as the intrinsic Fermi level (Ei). Thus, by using the oxide semiconductor film for a transistor, variation in the threshold voltage Vth of the transistor due to an oxygen vacancy and a shift of the threshold voltage ΔVth can be reduced.

A metal element is added to an oxide semiconductor film from the adjacent film including the metal element and a dopant is added thereto by an implantation method, thereby forming low-resistance regions including the metal element and the dopant in the oxide semiconductor film. With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

Thus, by using the transistor whose electric characteristics are good, a high-performance, highly reliable semiconductor device can be provided.

BRIEF DESCRIPTION OF THE DRAWINGS

FIGS. 10A and 10B each show one embodiment of a semiconductor device;

DETAILED DESCRIPTION OF THE INVENTION

Hereinafter, embodiments of the present invention disclosed in this specification are described with reference to the accompanying drawings. However, the present invention disclosed in this specification is not limited to the following description, and it will be easily understood by those skilled in the art that modes and details thereof can be variously changed. Therefore, the present invention disclosed in this specification is not construed as being limited to the description of the following embodiments. The ordinal numbers such as "first" and "second" are used for convenience and do not denote the order of steps and the stacking order of layers. The ordinal numbers in this specification do not denote particular names which specify the present invention, either.

Embodiment 1

In this embodiment, one embodiment of a semiconductor device and a method for manufacturing the semiconductor device is described with reference to FIGS. 1A to 1F. In this embodiment, a transistor including an oxide semiconductor film is described as an example of the semiconductor device.

There is no particular limitation on the structure of the transistor; for example, a staggered structure or a planar structure having a top gate structure or a bottom gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

A transistor 440 shown in FIGS. 1A to 1F is an example of a top-gate transistor.

Figure 1A:
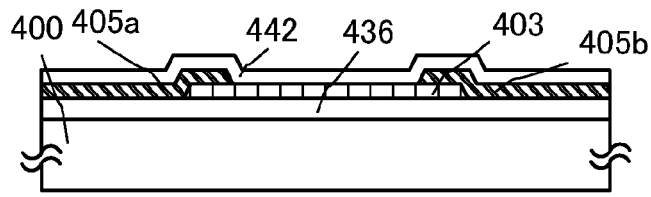
FIGS. 1A to 1F show one embodiment of a semiconductor device and a manufacturing method of the semiconductor device.
Figure 1B:
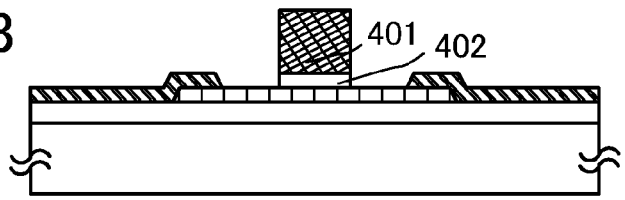
Figure 1C:
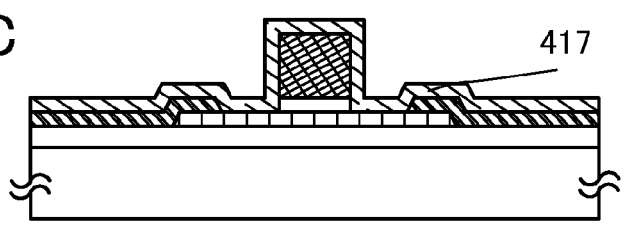
Figure 1D:
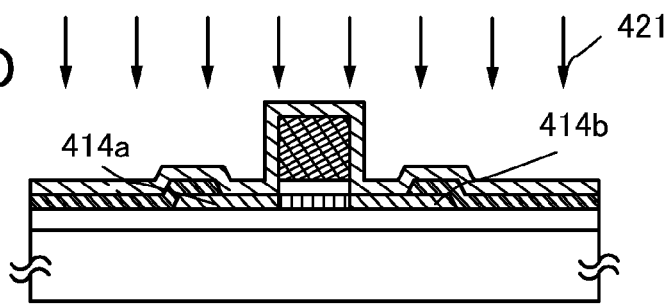
Figure 1E:
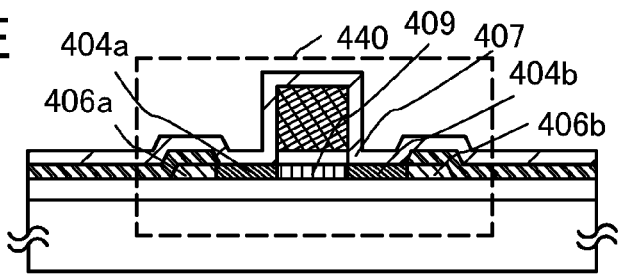
Figure 1F:
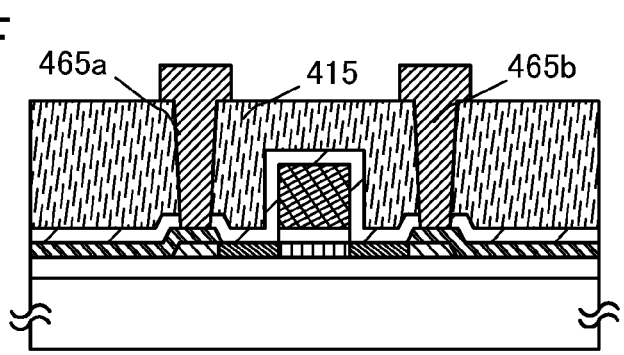

As shown in FIG. 1F, the transistor 440 includes an oxide semiconductor film 403 including a channel formation region 409, low-resistance regions 404a and 404b, and low-resistance regions 406a and 406b, a source electrode layer 405a, a drain electrode layer 405b, a gate insulating film 402, and a gate electrode layer 401 over a substrate 400 having an insulating surface over which an insulating film 436 is provided. A film 407 including a metal element is formed over the transistor 440.

FIGS. 1A to 1F illustrate an example of a method for manufacturing the transistor 440.

First, the insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, a sapphire substrate, or the like can be used. A single crystal semiconductor substrate or a polycrystalline semiconductor substrate of silicon, silicon carbide, or the like; a compound semiconductor substrate of silicon germanium or the like; an SOI substrate; or the like can also be used as the substrate 400, or such a substrate provided with a semiconductor element can also be used as the substrate 400.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a substrate, and then may be separated and transferred to a flexible substrate. For separation of the transistor from the substrate and transfer to the flexible substrate, a separation layer may be provided between the substrate and the transistor including the oxide semiconductor film.

The insulating film 436 can be formed by a plasma-enhanced CVD method, a sputtering method, or the like using silicon oxide, silicon oxynitride, aluminum oxide, aluminum oxynitride, hafnium oxide, gallium oxide, silicon nitride, silicon nitride oxide, aluminum nitride, aluminum nitride oxide, or a mixed material thereof.

The insulating film 436 has either a single-layer structure or a stacked-layer structure, in which an oxide insulating film is preferably used as the film to be in contact with the oxide semiconductor film 403. A silicon oxide film is formed by a sputtering method as the insulating film 436 in this embodiment.

Next, the oxide semiconductor film 403 is formed over the insulating film 436.

The insulating film 436, which is in contact with the oxide semiconductor film 403, preferably contains oxygen which exceeds at least the stoichiometric composition ratio in the film (the bulk). For example, in the case where a silicon oxide film is used as the insulating film 436, the composition formula is $SiO_{2+\alpha}$ ($\alpha>0$). With such a film as the insulating film 436, oxygen can be supplied to the oxide semiconductor film 403, leading to favorable characteristics. By supply of oxygen to the oxide semiconductor film 403, oxygen vacancies in the film can be compensated.

For example, an insulating film containing a large amount of (an excess of) oxygen, which is a supply source of oxygen, may be provided as the insulating film 436 so as to be in contact with the oxide semiconductor film 403, whereby oxygen can be supplied from the insulating film 436 to the oxide semiconductor film 403. Heat treatment may be performed in the state where the oxide semiconductor film 403 and the insulating film 436 are in contact with each other at least partly to supply oxygen to the oxide semiconductor film 403.

In order that hydrogen or water will be not contained in the oxide semiconductor film 403 as much as possible in the formation step of the oxide semiconductor film 403, it is preferable to heat the substrate provided with the insulating film 436 in a preheating chamber in a sputtering apparatus as a pretreatment for formation of the oxide semiconductor film 403 so that impurities such as hydrogen and moisture adsorbed to the substrate and/or the insulating film 436 are eliminated and evacuated. As an exhaustion unit provided in the preheating chamber, a cryopump is preferable.

An oxide semiconductor used for the oxide semiconductor film 403 preferably contains at least indium (In) or zinc (Zn). In particular, In and Zn are preferably contained. In addition, as a stabilizer for reducing the variation in electric characteristics of a transistor using the oxide, it is preferable to further contain gallium (Ga). Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: an indium oxide; a tin oxide; a zinc oxide; a two-component metal oxide such as an In—Zn-based oxide, an Sn—Zn-based oxide, an Al—Zn-based oxide, a Zn—Mg-based oxide, an Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, an Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, the In—Ga—Zn-based oxide means an oxide containing In, Ga, and Zn as its main components and there is no particular limitation on the ratio of In:Ga:Zn. The In—Ga—Zn-based oxide may further include a metal element other than In, Ga, and Zn.

Alternatively, a material represented by $InMO_3(ZnO)_m$ ($m>0$, m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ ($n>0$, n is an integer) may be used.

For example, an In—Ga—Zn-based oxide with an atomic ratio of In:Ga:Zn=1:1:1 (=1/3:1/3:1/3) or 2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, without limitation to the materials given above, a material with an appropriate composition may be used depending on requisite semiconductor characteristics (e.g., mobility, threshold voltage, and variation). To realize requisite semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, mobility can be increased by reducing the defect density in the bulk also with an In—Ga—Zn-based oxide.

For example, the "composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease; therefore, interface scattering of a transistor including the amorphous oxide semiconductor can be reduced, so that relatively high mobility can be obtained with relative ease.

In an oxide semiconductor having crystallinity, defects in the bulk can be more reduced, and mobility higher than that of the amorphous oxide semiconductor can be obtained by improving the surface flatness. To improve the surface flatness, the oxide semiconductor is preferably formed on a flat surface. Specifically, the oxide semiconductor may be formed on a surface with the average surface roughness (Ra) of less than or equal to 1 nm, preferably less than or equal to 0.3 nm, further preferably less than or equal to 0.1 nm.

The average surface roughness Ra is obtained by three-dimension expansion of center line average roughness that is defined by JIS B 0601 so as to be applied to a plane, and can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a measurement surface (a quadrangular region which is defined by four points represented by the coordinates $(x_1, y_1)$, $(x_1, y_2)$, $(x_2,$ $y_1$), and ($x_2$, $y_2$)), and $Z_0$ represents the average height of the measurement surface. The average surface roughness Ra can be measured with an atomic force microscope (AFM).

Therefore, planarizing treatment may be performed on the region of the insulating film 436 which is in contact with the oxide semiconductor film 403. As the planarizing treatment, polishing treatment (e.g., chemical mechanical polishing (CMP)), dry-etching treatment, or plasma treatment can be used, though there is no particular limitation on the planarizing treatment.

As the plasma treatment, a reverse sputtering in which an argon gas is introduced and plasma is produced can be performed. The reverse sputtering is a method in which voltage is applied to a substrate side with use of an RF power source in an argon atmosphere and plasma is generated in the vicinity of the substrate so that a substrate surface is modified. Instead of the argon atmosphere, a nitrogen atmosphere, a helium atmosphere, an oxygen atmosphere, or the like may be used. The reverse sputtering can remove particle substances (also referred to as particles or dust) attached to the top surface of the insulating film 436.

As the planarizing treatment, polishing treatment, dry-etching treatment, or plasma treatment may be performed plural times and/or in combination. Further, the order of steps of such a combination is not particularly limited and may be set as appropriate in accordance with roughness of the top surface of the insulating film 436.

As the oxide semiconductor film 403, an oxide semiconductor film including a crystal and having crystallinity (crystalline oxide semiconductor film) can be used. In the crystal state in the crystalline oxide semiconductor film, crystal axes are arranged either chaotically or with orientation.

For example, an oxide semiconductor film including a crystal having a c-axis which is substantially perpendicular to a surface of the oxide semiconductor film can be used as the crystalline oxide semiconductor film.

The oxide semiconductor film including a crystal having a c-axis which is substantially perpendicular to the surface of the oxide semiconductor film (hereinafter also referred to as a crystalline oxide semiconductor layer) has neither a single crystal structure nor an amorphous structure, and includes an oxide including a crystal with c-axis alignment (also referred to as a c-axis aligned crystal (CAAC)).

CAAC-OS is an oxide semiconductor containing a crystal with c-axis alignment which has a triangular or hexagonal atomic arrangement when seen from the direction of the a-b plane, the top surface, or the interface and in which metal atoms are arranged in a layered manner, or metal atoms and oxygen atoms are arranged in a layered manner along the c-axis, and the direction of the a-axis or the b-axis is varied in the a-b plane (or the top surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS is neither just single crystal nor just amorphous. Further, although the CAAC-OS includes a crystallized portion (crystalline portion), a boundary between one crystalline portion and another crystalline portion is not clear in some cases.

Nitrogen may be substituted for part of oxygen that is a constituent element of the CAAC-OS. The c-axes of individual crystalline portions included in the CAAC-OS may be aligned in one direction (e.g., a direction perpendicular to a surface of a substrate over which the CAAC-OS is formed or a top surface, a film surface, or an interface of the CAAC-OS). Further or alternatively, the normals of the a-b planes of the individual crystalline portions included in the CAAC-OS may be aligned in one direction (e.g., the direction perpendicular to the surface of the substrate, the top surface, the film surface, or the interface of the CAAC-OS).

The crystalline oxide semiconductor film enables a change of electric characteristics of the transistor due to irradiation with visible light or ultraviolet light to be further suppressed, leading to a highly reliable semiconductor device.

There are three methods for obtaining a crystalline oxide semiconductor film having c-axis alignment. The first is a method in which an oxide semiconductor film is deposited at a temperature(s) higher than or equal to 200° C. and lower than or equal to 500° C. such that the c-axis is substantially perpendicular to the top surface. The second is a method in which an oxide semiconductor film is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor film is deposited thin, and is subjected to heat treatment at a temperature(s) higher than or equal to 200° C. and lower than or equal to 700° C., and a second-layer oxide semiconductor film is deposited thereover, so that the c-axis is substantially perpendicular to the top surface.

The oxide semiconductor film 403 has a thickness greater than or equal to 1 nm and less than or equal to 200 nm (preferably greater than or equal to 5 nm and less than or equal to 30 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target, which is a so-called columnar plasma (CP) sputtering system.

The oxide semiconductor film 403 is preferably deposited under a condition such that much oxygen is contained (for example, by a sputtering method in an atmosphere of 100% oxygen) so as to be a film containing much oxygen (preferably having a region containing an excess of oxygen as compared to the stoichiometric composition ratio of the oxide semiconductor in a crystalline state).

As a target for forming the oxide semiconductor film 403 by a sputtering method, for example, an oxide target having a composition ratio of $In_2O_3$:$Ga_2O_3$:$ZnO$=1:1:2 [molar ratio] is used to form an In—Ga—Zn film. Without limitation to the material and the component of the target, for example, a metal oxide target having a composition ratio of $In_2O_3$:$Ga_2O_3$:$ZnO$=1:1:1 [molar ratio] may be used.

The filling factor of the metal oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which an impurity such as hydrogen, water, a hydroxyl group, or hydride is removed be used as a sputtering gas for the formation of the oxide semiconductor film.

The substrate is held in a deposition chamber kept under reduced pressure. Then, a sputtering gas in which hydrogen and moisture are removed is introduced into the deposition chamber from which remaining moisture is being removed, so that the oxide semiconductor film 403 is formed over the substrate 400 with the use of the target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The insulating film 436 and the oxide semiconductor film 403 are preferably formed in succession without exposure to the air. According to successive formation of the insulating film 436 and the oxide semiconductor film 403 without exposure to the air, impurities such as hydrogen and moisture can be prevented from being adsorbed onto a top surface of the insulating film 436.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of a substrate. The heat treatment can be performed under reduced pressure, a nitrogen atmosphere, or the like. For example, the substrate is put in an electric furnace which is a kind of heat treatment apparatus, and the oxide semiconductor film is subjected to heat treatment at 450° C. for one hour in a nitrogen atmosphere.

Further, the heat treatment apparatus is not limited to the electric furnace, and a device for heating an object by heat conduction or heat radiation from a heating element such as a resistance heating element may also be used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment with a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated to high temperature of 650° C. to 700° C., heated for several minutes, and taken out of the inert gas.

Such heat treatment for dehydration or dehydrogenation can be performed in the manufacturing process of the transistor 440 anytime after formation of the oxide semiconductor film 403 before formation of a film including a metal element before addition of oxygen into the oxide semiconductor film 403.

The heat treatment for dehydration or dehydrogenation is preferably performed before the oxide semiconductor film is processed into an island shape because oxygen included in the insulating film 436 can be prevented from being released by the heat treatment.

In the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or more, further preferably 7N (99.99999%) or more (that is, the impurity concentration is preferably 1 ppm or less, further preferably 0.1 ppm or less).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not included in the oxygen gas or the $N_2O$ gas. The purity of the oxygen gas or the $N_2O$ gas which is introduced into the heat treatment apparatus is preferably 6N or more, further preferably 7N or more (i.e., the impurity concentration in the oxygen gas or the $N_2O$ gas is preferably 1 ppm or less, further preferably 0.1 ppm or less). The oxygen gas or the $N_2O$ gas acts to supply oxygen that is a main constituent material of the oxide semiconductor and that is reduced by the step for removing an impurity for dehydration or dehydrogenation, so that the oxide semiconductor film 403 can be a high-purified, electrically i-type (intrinsic) oxide semiconductor film.

The oxide semiconductor film is either processed or not processed into an island shape. Further, an element isolation region formed of an insulating film for isolating the oxide semiconductor film per element may be provided.

In this embodiment, the oxide semiconductor film is processed into the island-shaped oxide semiconductor film 403 by a photolithography process. A resist mask for forming the island-shaped oxide semiconductor film 403 may be formed by an inkjet method. Formation of the resist mask by an inkjet method needs no photomask; thus, manufacturing cost can be reduced.

The etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Further, ITO07N (produced by KANTO CHEMICAL CO., INC.) may be used as well.

Next, a conductive film for forming a source electrode layer and a drain electrode layer (including a wiring formed of the same layer as the source electrode layer and the drain electrode layer) is formed over the oxide semiconductor film 403. The conductive film is formed of a material that can withstand heat treatment performed later. As the conductive film used for the source electrode layer and the drain electrode layer, for example, a metal film containing an element selected from Al, Cr, Cu, Ta, Ti, Mo, and W, a metal nitride film containing any of the above elements as its component (a titanium nitride film, a molybdenum nitride film, or a tungsten nitride film), or the like can be used. A metal film having a high melting point made of Ti, Mo, W, or the like or a metal nitride film made of any of these elements (a titanium nitride film, a molybdenum nitride film, or a tungsten nitride film) may be stacked on one of or both of a lower side and an upper side of a metal film made of Al, Cu, or the like. Alternatively, the conductive film used for the source electrode layer and the drain electrode layer may be formed of a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

A resist mask is formed over the conductive film by a photolithography process, and is selectively etched, so that the source electrode layer 405a and the drain electrode layer 405b are formed. Then, the resist mask is removed. In this embodiment, a 10-nm-thick tungsten film is formed as each of the source electrode layer 405a and the drain electrode layer 405b. Owing to the thickness of each of the source electrode layer 405a and the drain electrode layer 405b as described above, the coverage with a gate insulating film 442 formed thereover is improved, and a dopant can also be added to the oxide semiconductor film 403 under the source electrode layer 405a and the drain electrode layer 405b through the source electrode layer 405a and the drain electrode layer 405b.

Next, the gate insulating film 442 covering the oxide semiconductor film 403, the source electrode layer 405a, and the drain electrode layer 405b is formed (see FIG. 1A).

To improve the coverage with the gate insulating film 442, the above-described planarizing treatment may be performed also on the top surface of the oxide semiconductor film 403, and top surfaces of the source electrode layer 405a and the drain electrode layer 405b. It is preferable that the flatness of the top surface of the oxide semiconductor film 403 and the top surfaces of the source electrode layer 405a and the drain electrode layer 405b be good particularly when the thickness of the gate insulating film 442 is small.

The gate insulating film 442 has a thickness greater than or equal to 1 nm and less than or equal to 100 nm and can be formed by a sputtering method, an MBE method, a CVD method, a pulse laser deposition method, an ALD method, or the like as appropriate. The gate insulating film 442 may also be formed with a sputtering apparatus which performs film deposition in the state where top surfaces of a plurality of substrates are substantially perpendicular to a top surface of a sputtering target, which is a so-called CP sputtering system.

The gate insulating film 442 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 442 include oxygen in a portion which is in contact with the oxide semiconductor film 403. In particular, the gate insulating film 442 preferably contains an excess amount of oxygen which exceeds at least the stoichiometry composition ratio in the film (bulk); for example, in the case where a silicon oxide film is used as the gate insulating film 442, the composition formula is $SiO_{2+\alpha}$ ($\alpha>0$). In this embodiment, a silicon oxide film of $SiO_{2+\alpha}$ ($\alpha>0$) is used as the gate insulating film 442. By using the silicon oxide film as the gate insulating film 442, oxygen can be supplied to the oxide semiconductor film 403, leading to good characteristics. Further, the gate insulating film 442 is preferably formed in consideration of the size of a transistor and the step coverage with the gate insulating film 442.

The gate insulating film 442 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Further, the gate insulating film 442 has either a single-layer structure or a stacked-layer structure.

Next, the gate electrode layer 401 is formed over the gate insulating film 442 by a plasma-enhanced CVD method, a sputtering method, or the like. The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 has either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above-described conductive material and the above-described metal material.

As one layer of the gate electrode layer 401 which is in contact with the gate insulating film 442, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function of 5 eV or higher, preferably 5.5 eV or higher, which enables the threshold voltage, which is one of electric characteristics of the transistor, to be a positive value when used for the gate electrode layer; accordingly, a so-called normally-off switching element can be provided.

Next, the gate insulating film 442 is etched with the gate electrode layer 401 as a mask to expose part of the oxide semiconductor film 403, so that the gate insulating film 402 is formed (see FIG. 1B).

Next, a film 417 including a metal element is formed over the oxide semiconductor film 403, the source electrode layer 405a, the drain electrode layer 405b, the gate insulating film 402, and the gate electrode layer 401 to be in contact with the part of the oxide semiconductor film 403 (see FIG. 1C).

A metal film, a metal oxide film, a metal nitride film, and the like are given as examples of the film 417 including the metal element.

As the metal element included in the film including the metal element, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used. As the film including the metal element, a metal film, a metal oxide film, or a metal nitride film including at least one of the above-described metal elements (such a metal nitride film is, for example, a titanium nitride film, a molybdenum nitride film, or a tungsten nitride film) can be used. Further, a dopant such as phosphorus (P) or boron (B) may be included in the film including the metal element. In this embodiment, the film 417 including the metal element has electrical conductivity.

The film 417 including the metal element can be formed by a plasma-enhanced CVD method, a sputtering method, an evaporation method, or the like. The thickness of the film 417 including the metal element may be greater than or equal to 5 nm and less than or equal to 30 nm.

In this embodiment, a 10-nm-thick aluminum film is formed by a sputtering method as the film 417 including the metal element.

Next, a dopant 421 is selectively added to the oxide semiconductor film 403 through the film 417 including the metal element, the source electrode layer 405a, and the drain electrode layer 405b with the gate insulating film 402 and the gate electrode layer 401 as a mask, so that low-resistance regions 414a and 414b are formed (see FIG. 1D).

In the example described in this embodiment, the source electrode layer 405a and the drain electrode layer 405b are each formed as a thin film, and thus the dopant 421 is also added to the oxide semiconductor film in regions under the source electrode layer 405a and the drain electrode layer 405b, so that the low-resistance regions 414a and 414b are formed. The dopant 421 is not added to the oxide semiconductor film 403 in the regions under the source electrode layer 405a and the drain electrode layer 405b in some cases, or the dopant 421 is added to the oxide semiconductor film 403 in the regions under the source electrode layer 405a and the drain electrode layer 405b such that the resistance in each region is higher than that of the other region in some cases, depending on the thickness of each of the source electrode layer 405a and the drain electrode layer 405b and the condition of addition of the dopant 421.

The dopant 421 is an impurity by which the electrical conductivity of the oxide semiconductor film 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant may be included in the film 417 including the metal element.

The dopant 421 is added to the oxide semiconductor film 403 through the film 417 including the metal element, the source electrode layer 405a, and the drain electrode layer 405b by an implantation method. As the method for adding the dopant 421, an ion implantation method, an ion doping method, a plasma immersion ion implantation method, or the like can be used. In that case, it is preferable to use a single ion of the dopant 421 or a hydride ion, a fluoride ion, or a chloride ion thereof.

The addition of the dopant 421 may be controlled by setting the addition conditions such as the accelerated voltage and the dosage, or the thickness of the film 417 including the metal element as appropriate. For example, for addition of an boron ion by an ion implantation method using boron, the accelerated voltage and the dosage may be set to 15 kV and $1\times10^{15}$ ions/cm$^2$, respectively. The dosage is preferably set to be greater than or equal to $1\times10^{13}$ ions/cm$^2$ and less than or equal to $5\times10^{16}$ ions/cm$^2$.

The concentration of the dopant 421 in the low-resistance region is preferably greater than or equal to $5\times10^{18}$ atoms/cm$^3$ and less than or equal to $1\times10^{22}$ atoms/cm$^3$.

The substrate 400 may be heated in adding the dopant.

The addition of the dopant 421 into the oxide semiconductor film 403 may be performed plural times, and the number of kinds of dopant may be plural.

Further, heat treatment may be performed thereon after the addition of the dopant 421. The heat treatment is preferably performed at a temperature(s) higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In the case where the oxide semiconductor film 403 is a crystalline oxide semiconductor film, the oxide semiconductor film 403 may be partly amorphized by the addition of the dopant 421. In that case, the crystallinity of the oxide semiconductor film 403 can be recovered by performing heat treatment thereon after the addition of the dopant 421.

Next, heat treatment is performed in the state where the film 417 including the metal element and the oxide semiconductor film 403 are partly in contact with each other. The heat treatment is preferably performed under an oxygen atmosphere. The heat treatment can also be performed under reduced pressure or a nitrogen atmosphere. The heating temperature may be set to be higher than or equal to 100° C. and lower than or equal to 700° C., preferably higher than or equal to 200° C. and lower than or equal to 400° C.

For example, the substrate is put in an electric furnace which is one of heat treatment apparatuses, and heat treatment is performed on the film 417 including the metal element and the oxide semiconductor film 403 at 300° C. for 1 hour in an oxygen atmosphere.

Further, the heat treatment apparatus is not limited to the electric furnace; a device for heating an object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object by heat treatment, such as nitrogen or a rare gas like argon, is used.

For example, as the heat treatment, GRTA may be performed as follows: the substrate is put in an inert gas heated at a high temperature of 650° C. to 700° C., is heated for several minutes, and is taken out of the inert gas.

The heat treatment may be performed under an atmosphere of nitrogen, oxygen, ultra-dry air (air in which the water content is 20 ppm or less, preferably 1 ppm or less, further preferably 10 ppb or less), or a rare gas (argon, helium, or the like). It is preferable that water, hydrogen, or the like be not contained in the atmosphere of nitrogen, oxygen, ultra-dry air, or a rare gas. It is also preferable that the purity of nitrogen, oxygen, or the rare gas which is introduced into the heat treatment apparatus be 6N (99.9999%) or higher, preferably 7N (99.99999%) or higher (that is, the impurity concentration is 1 ppm or lower, preferably 0.1 ppm or lower).

Through the heat treatment, the metal element is added to the oxide semiconductor film 403 from the film 417 including the metal element, so that the low-resistance regions 404a and 404b are formed. Accordingly, the low-resistance regions 404a and 404b including the dopant and the metal element and the low-resistance regions 406a and 406b including the dopant are formed in the oxide semiconductor film 403 to sandwich the channel formation region 409 between the low-resistance regions 404a and 404b and between the low-resistance regions 406a and 406b. The resistance of the low-resistance regions 404a and 404b including the dopant and the metal element can be lower than that of the low-resistance regions 406a and 406b including the dopant.

In this embodiment, boron is used as the dopant and aluminum is used as the metal element, and therefore the low-resistance regions 404a and 404b contain boron and aluminum and the low-resistance regions 406a and 406b contain boron.

The heat treatment for adding the metal element from the film 417 including the metal element to the oxide semiconductor film 403 makes the film 417 including the metal element the film 407 including the metal element. For example, a metal film which is used as the film 417 including the metal element is made to be a metal oxide insulating film as the film 407 including the metal element. Such a metal oxide film can be used as an insulating film. In this embodiment, an aluminum film is used as the film 417 including the metal element, and is therefore made to be an aluminum oxide film by the heat treatment. The aluminum oxide film, which is a metal oxide insulating film, can be used as an insulating film.

Through the above-described process, the transistor 440 of this embodiment can be manufactured (see FIG. 1E). With the oxide semiconductor film 403 including the low-resistance regions 404a and 404b and 406a and 406b between which the channel formation region 409 is provided in the channel length direction, on-state characteristics (e.g., on-state current and field-effect mobility) of the transistor 440 are increased, which enables high-speed operation and high-speed response of the transistor.

The low-resistance regions 404a, 404b, 406a, and 406b each can be functioned as a source region or a drain region. With the low-resistance regions 404a and 404b, the electrical field applied to the channel formation region 409 formed between the low-resistance regions 404a and 404b can be relaxed. Further, electrical connection between the oxide semiconductor film 403 and each of the source electrode layer 405a and the drain electrode layer 405b in the low-resistance regions 406a and 406b, respectively, can reduce the contact resistance between the oxide semiconductor film 403 and each of the source electrode layer 405a and the drain electrode layer 405b.

An insulating film may be stacked on the film 407 including the metal element which is a metal oxide insulating film.

Further, the film 407 including the metal element may be removed. For example, in the case where the film 407 including the metal element has electrical conductivity, the film 407 including the metal element may be removed and instead an insulating film 416 may be formed as shown in FIGS. 6A to 6D.

Figure 6A:
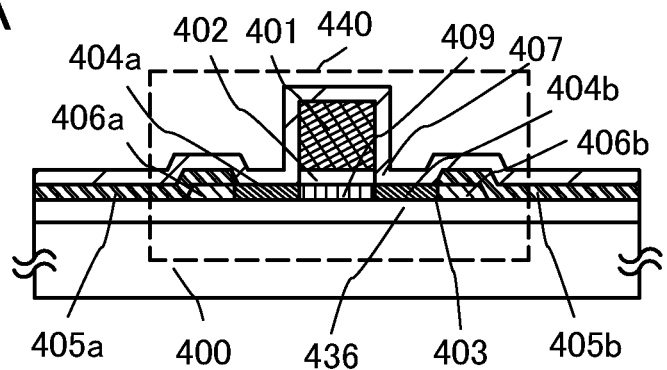
FIGS. 6A to 6D show one embodiment of a semiconductor device and a manufacturing method of the semiconductor device.
Figure 6B:
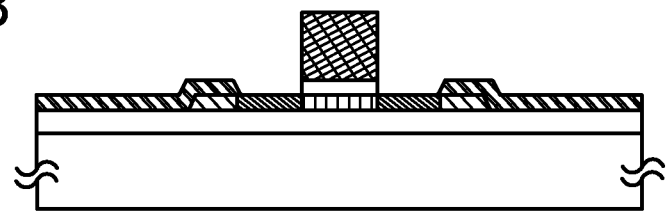

FIG. 6A corresponds to FIG. 1E, in which the film 407 including the metal element is formed to cover the transistor 440. The film 407 including the metal element can be used as an insulating film as it is in the case where the film 407 including the metal element has an insulation property, but is removed in the case where it has electrical conductivity or another insulating film is provided instead (see FIG. 6B).

Figure 6C:
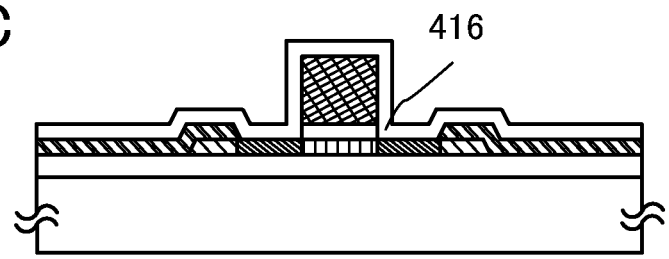
Figure 6D:
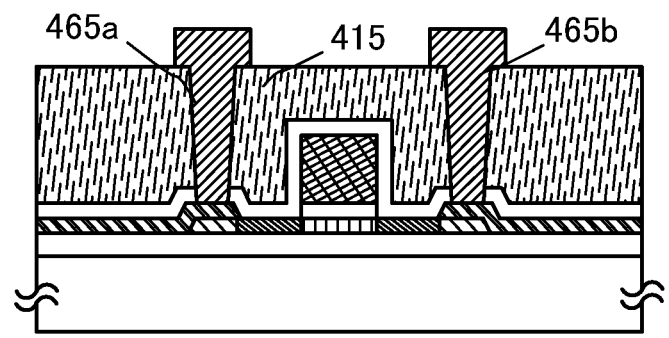

Then, the insulating film 416 is provided to cover the transistor 440 (see FIG. 6C).

The insulating film 416 is preferably formed as appropriate by a method such as a sputtering method, in which an impurity such as water or hydrogen does not enter the insulating film 416. It is preferable that the insulating film 416 include an excess of oxygen because it serves as a supply source of oxygen to the oxide semiconductor film 403.

In this embodiment, a silicon oxide film with a thickness of 100 nm is formed as the insulating film 416 by a sputtering method. The silicon oxide film can be formed by a sputtering method under a rare gas (a typical example thereof is argon) atmosphere, an oxygen atmosphere, or a mixed atmosphere of a rare gas and oxygen.

Similarly to the formation of the oxide semiconductor film, to remove residual moisture from the deposition chamber for the insulating film 416, an entrapment vacuum pump (such as a cryopump) is preferably used. By depositing the insulating film 416 in the deposition chamber evacuated using a cryopump, the impurity concentration of the insulating film 416 can be reduced. As the evacuation unit for removing moisture remaining in the deposition chamber for the insulating film 416, a turbo molecular pump provided with a cold trap may be used as well.

A high-purity gas from which impurities such as hydrogen, water, a hydroxyl group, and hydride are removed is preferably used as a sputtering gas for the formation of the insulating film 416.

The insulating film 416 can have a stacked-layer structure, in which case an inorganic insulating film such as, as typical example, an aluminum oxide film, a silicon oxynitride film, an aluminum oxynitride film, or a gallium oxide film can be used in addition to the silicon oxide film. For example, a stacked layer of a silicon oxide film and an aluminum oxide film can be used as the insulating film 416.

The aluminum oxide film which can be used as either of the film 407 including the metal element or the insulating film 416 provided over the oxide semiconductor film 403 has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film 403 and release of oxygen, which is a main constituent material of the oxide semiconductor, from the oxide semiconductor film 403.

Further, a planarization insulating film may be formed thereover in order to reduce surface roughness due to the transistor. As the planarization insulating film, an organic material such as polyimide, acrylic, or a benzocyclobutene-based resin can be used. Other than such organic materials, it is also possible to use a low-dielectric constant material (a low-k material) or the like. The planarization insulating film may be formed by stacking a plurality of insulating films formed using these materials.

In this embodiment, a planarization insulating film 415 is formed over the film 407 including the metal element or the insulating film 416. Further, respective openings reaching the source electrode layer 405a and the drain electrode layer 405b are formed in the film 407 including the metal element or the insulating film 416 and the planarization insulating film 415, and a wiring layer 465a and a wiring layer 465b electrically connected to the source electrode layer 405a and the drain electrode layer 405b, respectively, are formed in the openings (see FIGS. 1F and 6D).

Alternatively, as shown in FIGS. 3A to 3F, the source electrode layer 405a and the drain electrode layer 405b may be provided over the film 407 including the metal element and the insulating film 416, like the wiring layer 465a and the wiring layer 465b.

In FIGS. 3A to 3F, the source electrode layer 405a and the drain electrode layer 405b are not formed to cover parts of the oxide semiconductor film 403, unlike FIGS. 1A to 1F; therefore, the metal element and the dopant are added to the oxide semiconductor film 403 in a region other than the channel formation region 409 which overlaps with the gate electrode layer 401. Thus, a transistor 445 in which the low-resistance regions between which the channel formation region 409 is provided consist of the low-resistance regions 404a and 404b including the metal element and the dopant is formed.

Figure 3A:
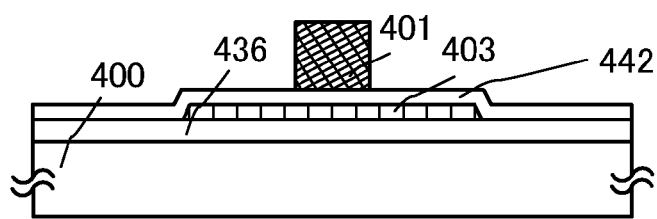
FIGS. 3A to 3F show one embodiment of a semiconductor device and a manufacturing method of the semiconductor device.
Figure 3B:
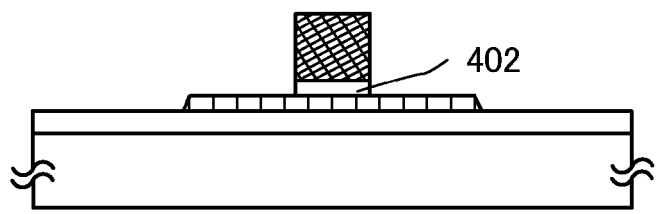
Figure 3C:
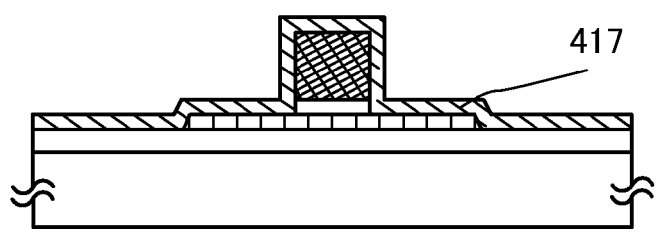
Figure 3D:
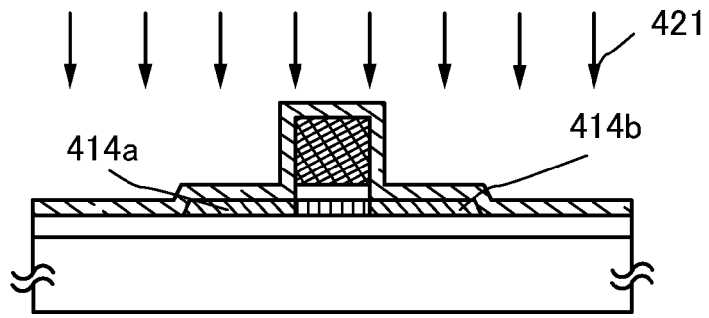
Figure 3E:
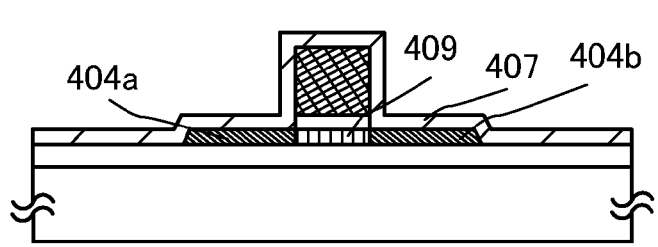
Figure 3F:
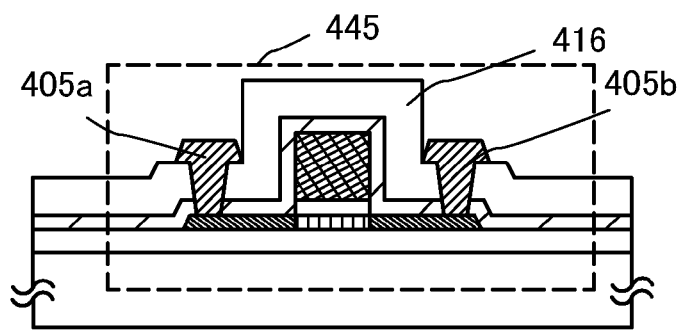

In one example of a semiconductor device shown in FIG. 3F, the film 407 including the metal element, which is a metal oxide insulating film, and the insulating film 416 are stacked over the transistor 445, and the source electrode layer 405a and the drain electrode layer 405b are formed in respective openings which reach the low-resistance regions 404a and 404b and are formed in the film 407 including the metal element and the insulating film 416.

Figure 7A:
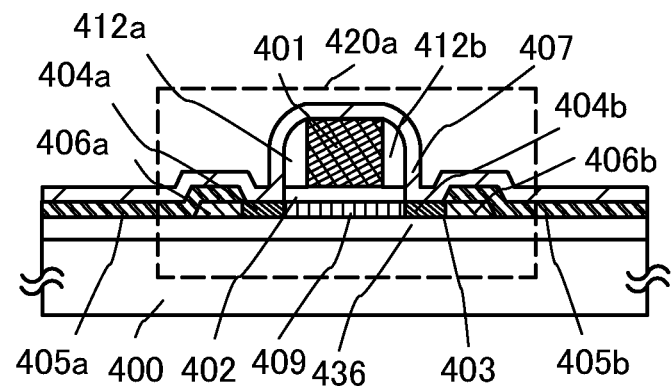
FIGS. 7A and 7B each show one embodiment of a semiconductor device.
Figure 7B:
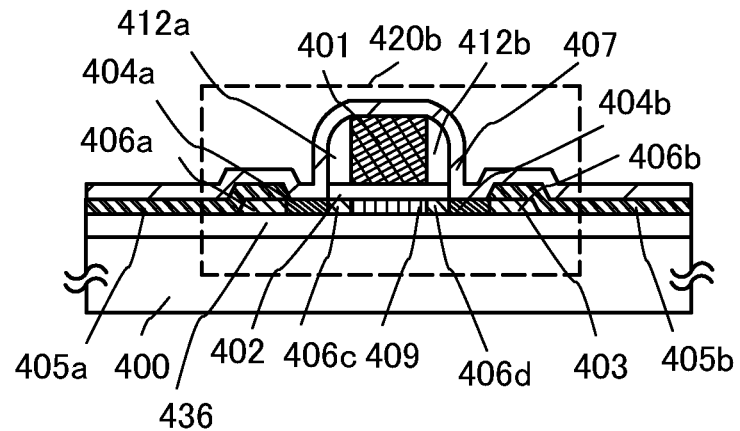

As shown in FIGS. 7A and 7B, a sidewall insulating layer 412a, 412b may be provided on the side surface of the gate insulating layer 401. The sidewall insulating layer 412a, 412b may be formed on the side surface of the gate electrode layer 401 in a self-aligned manner by forming an insulating film to cover the gate electrode layer 401 and then processing the insulating film by anisotropic etching by an RIE (reactive ion etching) method. There is no particular limitation on the insulating film; for example, a silicon oxide film with favorable step coverage, which is formed by reacting TEOS (tetraethyl ortho-silicate), silane, or the like with oxygen, nitrous oxide, or the like can be used. The insulating film can be formed by a thermal CVD method, a plasma-enhanced CVD method, a normal-pressure CVD method, a bias ECRCVD method, a sputtering method, or the like. A silicon oxide film formed by a low temperature oxidation (LTO) method may also be used.

In FIGS. 7A and 7B, the gate insulating film 402 can be formed by etching the gate insulating film with the gate electrode layer 401 and the sidewall insulating layer 412a, 412b used as a mask.

Further, in FIGS. 7A and 7B, the insulating film over the gate electrode layer 401 is removed by etching to expose the gate electrode layer 401; alternatively, the sidewall insulating layer 412a, 412b may be formed while the insulating film above the gate electrode layer 401 remains. Further, a protective film may be formed over the gate electrode layer 401 in a later step. By protecting the gate electrode layer 401 in such a manner, film reduction of the gate electrode layer in the etching process can be prevented. Various etching methods such as a dry etching method and a wet etching method may be used for the etching.

In the case where the sidewall insulating layer 412a, 412b is formed before the addition of the dopant, as shown in FIG. 7A, the sidewall insulating layer 412a, 412b also serves as a mask in the addition of the dopant; thus, a transistor 420a in which the dopant is not added to the oxide semiconductor film 403 below the sidewall insulating layer 412a, 412b is formed.

On the other hand, in the case where the sidewall insulating layer 412a, 412b is formed after the addition of the dopant, as shown in FIG. 7B, the dopant is also added to the oxide semiconductor film 403 below the sidewall insulating layer 412a, 412b; thus, a transistor 420b including low-resistance regions 406c and 406d including the dopant is formed.

In the oxide semiconductor film 403 which is highly purified and whose oxygen vacancies are repaired, impurities such as hydrogen and water are sufficiently removed; the hydrogen concentration in the oxide semiconductor film 403 is less than or equal to $5\times10^{19}$ atoms/cm$^3$, preferably less than or equal to $5\times10^{18}$ atoms/cm$^3$. The hydrogen concentration in the oxide semiconductor film 403 is measured by secondary ion mass spectrometry (SIMS).

The number of carriers in the oxide semiconductor film 403 is extremely small (close to zero); the carrier concentration is less than $1\times10^{14}$/cm$^3$, preferably less than $1\times10^{12}$/cm$^3$, further preferably less than $1\times10^{11}$/cm$^3$.

The current value in the off state (off-state current value) of the transistor 440 using the highly purified oxide semiconductor film 403 containing an excess of oxygen that repairs an oxygen vacancy according to this embodiment is less than or equal to 100 zA per micrometer of channel width at room temperature (1 zA (zeptoampere)=$1\times10^{-21}$ A), preferably less than or equal to 10 zA/μm, further preferably less than or equal to 1 zA/μm, still further preferably less than or equal to 100 yA/μm.

By using the transistor whose electric characteristics are good, a high-performance, highly reliable semiconductor device can be provided.

Embodiment 2

In this embodiment, another embodiment of a semiconductor device and a method for manufacturing the semiconductor device is described with reference to FIGS. 2A to 2D. The above embodiment can be applied to the same portion as, a portion having a function similar to, or a step similar to that in the above embodiment; thus, repetitive description is omitted. In addition, detailed description of the same portions is also omitted.

Described in this embodiment is an example of a manufacturing method of a semiconductor device according to one embodiment of the present invention, in which a step of adding a metal element to an oxide semiconductor film is performed before a step of adding a dopant thereto.

FIGS. 2A to 2D illustrate an example of a method for manufacturing a transistor 440 of this embodiment.

Figure 2A:
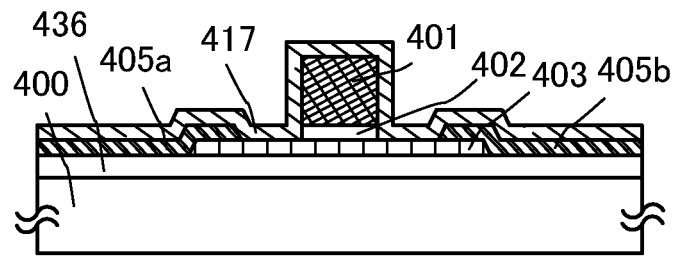
FIGS. 2A to 2D show one embodiment of a semiconductor device and a manufacturing method of the semiconductor device.

FIG. 2A corresponds to FIG. 1C, in which an oxide semiconductor film 403, a source electrode layer 405a, a drain electrode layer 405b, a gate insulating film 402, a gate electrode layer 401, and a film 417 including a metal element are formed over a substrate 400 having an insulating surface over which an insulating film 436 is provided.

In this embodiment, a 10-nm-thick aluminum film is formed by a sputtering method as the film 417 including the metal element.

Next, heat treatment is performed in the state where the film 417 including the metal element is in contact with part of the oxide semiconductor film 403. The heat treatment is preferably performed under an oxygen atmosphere. The heat treatment can also be performed under reduced pressure or a nitrogen atmosphere. The heating temperature may be set to be higher than or equal to 100° C. and lower than or equal to 700° C., preferably higher than or equal to 200° C. and lower than or equal to 400° C.

For example, the substrate is put into an electric furnace which is one of heat treatment apparatuses, and heat treatment is performed on the film 417 including the metal element and the oxide semiconductor film 403 at 300° C. for 1 hour in an oxygen atmosphere.

Figure 2B:
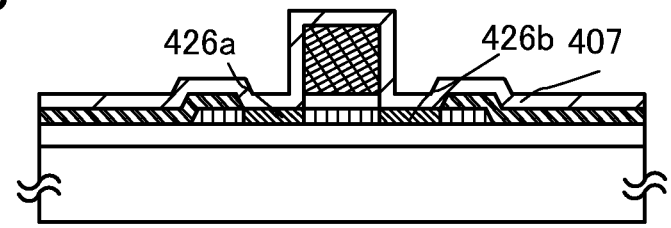

By the heat treatment, the metal element is added to the oxide semiconductor film 403 from the film 417 including the metal element, so that low-resistance regions 426a and 426b are formed (see FIG. 2B). The low-resistance regions 426a and 426b include the metal element.

The film 417 including the metal element is turned into a film 407 including a metal element to the oxide semiconductor film 403 by the heat treatment for adding the metal element. For example, a metal film used as the film 417 including the metal element is turned into a metal oxide insulating film as the film 407 including the metal element. Such a metal oxide film can be used as an insulating film. In this embodiment, the aluminum film used as the film 417 including the metal element is turned into an aluminum oxide film by the heat treatment. The aluminum oxide film, which is a metal oxide insulating film, can be used as an insulating film.

Next, a dopant 421 is selectively added to the oxide semiconductor film 403 through the film 407 including the metal element, the source electrode layer 405a, and the drain electrode layer 405b with the gate insulating film 402 and the gate electrode layer 401 used as a mask, so that low-resistance regions 404a and 404b are formed.

In the example described in this embodiment, the source electrode layer 405a and the drain electrode layer 405b are each formed as a thin film, and thus the dopant 421 is also added to the oxide semiconductor film in regions below the source electrode layer 405a and the drain electrode layer 405b, so that low-resistance regions 406a and 406b are formed. The dopant 421 is not added to the oxide semiconductor film 403 in the regions below the source electrode layer 405a and the drain electrode layer 405b in some cases, depending on the thickness of each of the source electrode layer 405a and the drain electrode layer 405b and the condition of addition of the dopant 421.

In this embodiment, boron is used as the dopant 421, whose ion is added by an ion implantation method.

In this manner, both the low-resistance regions 404a and 404b including the dopant and the metal element and the low-resistance regions 406a and 406b are formed to sandwich a channel formation region 409 in the oxide semiconductor film 403. The resistance can be lower in the low-resistance regions 404a and 404b than in the low-resistance regions 406a and 406b.

Figure 2C:
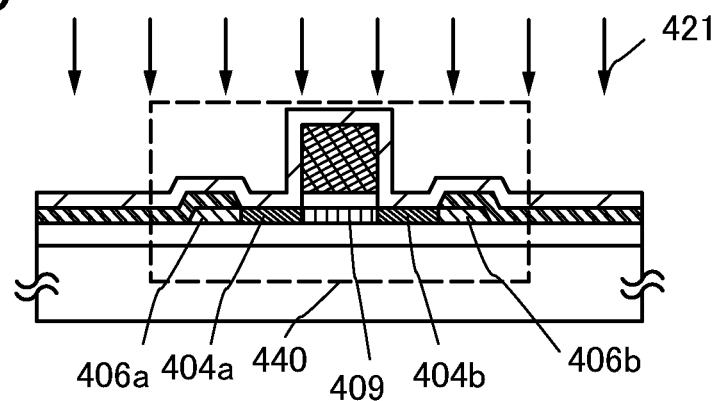
Figure 2D:
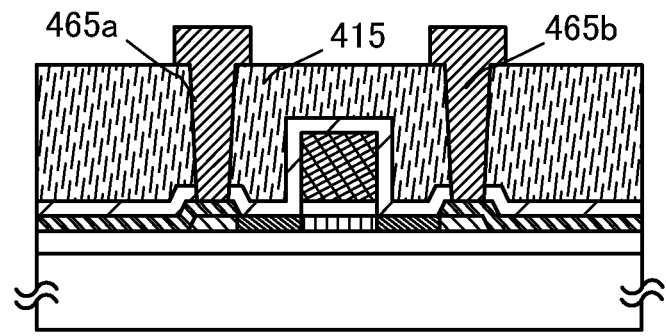

Through the above process, the transistor 440 of this embodiment can be manufactured (see FIG. 2C). With the oxide semiconductor film 403 including the low-resistance regions 404a and 404b and the low-resistance regions 406a and 406b with the channel formation region 409 provided between the low-resistance regions 404a and 404b and between the low-resistance regions 406a and 406b in the channel length direction, on-state characteristics (e.g., on-state current and field-effect mobility) of the transistor 440 are increased, which enables high-speed operation and high-speed response of the transistor 440.

The low-resistance regions 404a and 404b and the low-resistance regions 406a and 406b each can be functioned as a source region or a drain region. With the low-resistance regions 404a and 404b, the electric field applied to the channel formation region 409 between the low-resistance regions 404a and 404b can be relaxed. Further, electrical connection between the oxide semiconductor film 403 and each of the source electrode layer 405a and the drain electrode layer 405b in the low-resistance regions 406a and 406b can reduce the contact resistance between the oxide semiconductor film 403 and each of the source electrode layer 405a and the drain electrode layer 405b.

In this embodiment, a planarization insulating film 415 is formed over the film 407 including the metal element. Further, an opening reaching the source electrode layer 405a and an opening reaching the drain electrode layer 405b are formed in the film 407 including the metal element and the planarization insulating film 415, and a wiring layer 465a and a wiring layer 465b which are electrically connected to the source electrode layer 405a and the drain electrode layer 405b respectively are formed in the openings (see FIG. 2D).

In this manner, by using the transistor whose electric characteristics are good, a high-performance, highly reliable semiconductor device can be provided.

This embodiment can be implemented combining with any other embodiment as appropriate.

Embodiment 3

In this embodiment, another embodiment of a semiconductor device and a method for manufacturing the semiconductor device is described with reference to FIGS. 4A to 4F. The above embodiment can be applied to the same portion as, a portion having a function similar to, or a step similar to that in the above embodiment; thus, repetitive description is omitted. In addition, detailed description of the same portions is also omitted.

Described in this embodiment is an example of a manufacturing method of a transistor in which each of a source electrode layer and a drain electrode layer is connected to an oxide semiconductor film in a manner different from that in Embodiment 1 and Embodiment 2.

FIGS. 4A to 4F illustrate an example of a method for manufacturing a transistor 450.

First, an insulating film 436 is formed over a substrate 400.

Next, a conductive film for forming a source electrode layer and a drain electrode layer (including a wiring formed of the same layer) is formed over the insulating film 436.

A resist mask is formed over the conductive film by a photolithography process, and is selectively etched, so that a source electrode layer 405a and a drain electrode layer 405b are formed. Then, the resist mask is removed.

Next, an oxide semiconductor film 403 is formed over the insulating film 436, the source electrode layer 405a, and the drain electrode layer 405b. Then, a gate insulating film 442 is formed to cover the oxide semiconductor film 403 (see FIG. 4A).

A gate electrode layer 401 is formed over the gate insulating film 442.

Figure 4A:
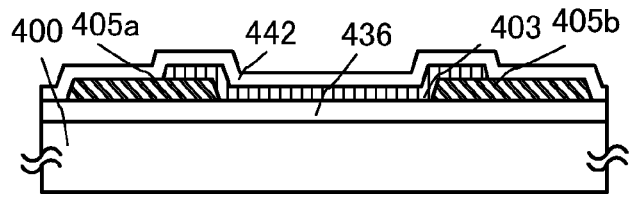
FIGS. 4A to 4F show one embodiment of a semiconductor device and a manufacturing method of the semiconductor device.
Figure 4B:
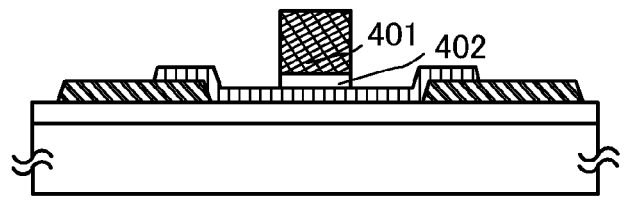

Next, the gate insulating film 442 is etched with the gate electrode layer 401 as a mask to expose part of the oxide semiconductor film 403, so that a gate insulating film 402 is formed (see FIG. 4B).

Figure 4C:
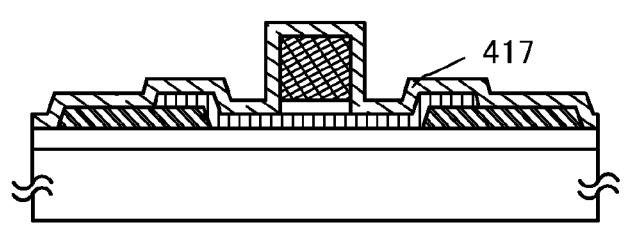

Next, a film 417 including a metal element is formed over the source electrode layer 405a, the drain electrode layer 405b, the oxide semiconductor film 403, the gate insulating film 402, and the gate electrode layer 401 to be in contact with the part of the oxide semiconductor film 403 (see FIG. 4C).

In this embodiment, a 10-nm-thick aluminum film is formed by a sputtering method as the film 417 including the metal element.

Figure 4D:
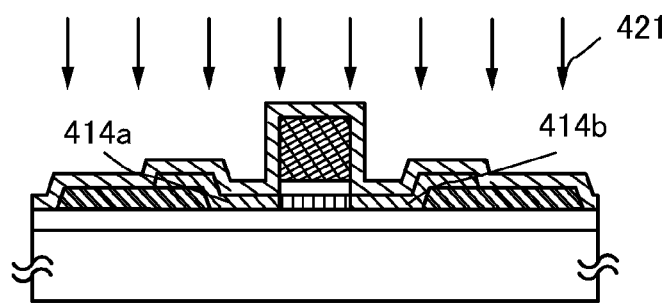

Next, a dopant 421 is selectively added to the oxide semiconductor film 403 through the film 417 including the metal element with the gate insulating film 402 and the gate electrode layer 401 as a mask, so that low-resistance regions 414a and 414b are formed (see FIG. 4D).

In this embodiment, phosphorus is used as the dopant 421, whose ion is added by an ion implantation method to the oxide semiconductor film 403.

The concentration of the dopant 421 in the low-resistance region is preferably greater than or equal to $5\times10^{18}$ atoms/cm$^3$ and less than or equal to $1\times10^{22}$ atoms/cm$^3$.

Heat treatment may be performed thereon after the addition of the dopant 421. The heat treatment is preferably performed at a temperature(s) higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

Next, heat treatment is performed in the state where the film 417 including the metal element and the oxide semiconductor film 403 are partly in contact with each other. The heat treatment is preferably performed under an oxygen atmosphere. The heat treatment can also be performed under reduced pressure or a nitrogen atmosphere. The heating temperature may be set to be higher than or equal to 100° C. and lower than or equal to 700° C., preferably higher than or equal to 200° C. and lower than or equal to 400° C.

For example, the substrate is put in an electric furnace which is one of heat treatment apparatuses, and heat treatment is performed on the film 417 including the metal element and the oxide semiconductor film 403 at 300° C. for 1 hour in an oxygen atmosphere.

Through the heat treatment, the metal element is added to the oxide semiconductor film 403 from the film 417 including the metal element, so that low-resistance regions 404a and 404b are formed. Accordingly, the low-resistance regions 404a and 404b including the dopant and the metal element are formed in the oxide semiconductor film 403 to sandwich a channel formation region 409 therebetween. The resistance of the low-resistance regions 404a and 404b including the dopant and the metal element can be low.

In this embodiment, phosphorus is used as the dopant and aluminum is used as the metal element, and therefore the low-resistance regions 404a and 404b contain phosphorus and aluminum.

The heat treatment for adding the metal element from the film 417 including the metal element to the oxide semiconductor film 403 makes the film 417 including the metal element a film 407 including a metal element. For example, a metal film which is used as the film 417 including the metal element is made to be a metal oxide insulating film as the film 407 including the metal element. Such a metal oxide film can be used as an insulating film. In this embodiment, an aluminum film is used as the film 417 including the metal element, and is therefore made to be an aluminum oxide film by the heat treatment. The aluminum oxide film, which is a metal oxide insulating film, can be used as an insulating film.

Figure 4E:
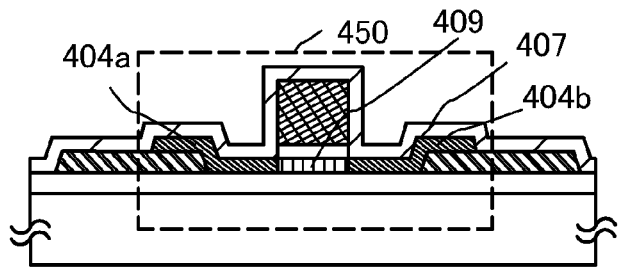
Figure 4F:
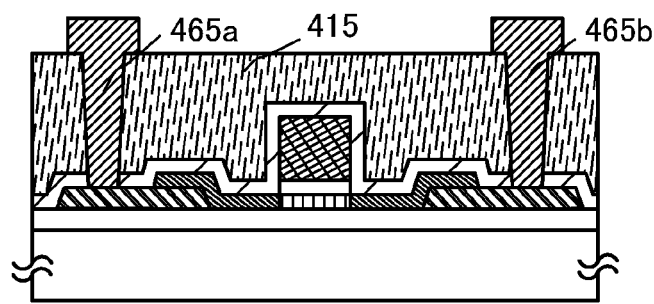

Through the above-described process, the transistor 450 of this embodiment can be manufactured (see FIG. 4E). With the oxide semiconductor film 403 including the low-resistance regions 404a and 404b between which the channel formation region 409 is provided in the channel length direction, on-state characteristics (e.g., on-state current and field-effect mobility) of the transistor 450 are increased, which enables high-speed operation and high-speed response of the transistor.

The low-resistance regions 404a and 404b each can be functioned as a source region or a drain region. With the low-resistance regions 404a and 404b, the electrical field applied to the channel formation region 409 formed between the low-resistance regions 404a and 404b can be relaxed. Further, electrical connection between the oxide semiconductor film 403 and each of the source electrode layer 405a and the drain electrode layer 405b in the low-resistance regions 404a and 404b, respectively, can reduce the contact resistance between the oxide semiconductor film 403 and each of the source electrode layer 405a and the drain electrode layer 405b.

In this embodiment, a planarization insulating film 415 is formed over the film 407 including the metal element. Further, respective openings reaching the source electrode layer 405a and the drain electrode layer 405b are formed in the film 407 including the metal element and the planarization insulating film 415, and a wiring layer 465a and a wiring layer 465b electrically connected to the source electrode layer 405a and the drain electrode layer 405b, respectively, are formed in the openings (see FIG. 4F).

In this manner, by using the transistor whose electric characteristics are good, a high-performance, highly reliable semiconductor device can be provided.

This embodiment can be implemented combining with any other embodiment as appropriate.

Embodiment 4

In this embodiment, another embodiment of a semiconductor device and a method for manufacturing the semiconductor device is described with reference to FIGS. 5A to 5D. The above embodiment can be applied to the same portion as, a portion having a function similar to, or a step similar to that in the above embodiment; thus, repetitive description is omitted. In addition, detailed description of the same portions is also omitted.

Described in this embodiment is an example of a manufacturing method of a semiconductor device according to one embodiment of the present invention, in which a step of adding a metal element to an oxide semiconductor film is performed before a step of adding a dopant thereto.

FIGS. 5A to 5D illustrate an example of a method for manufacturing a transistor 450 of this embodiment.

Figure 5A:
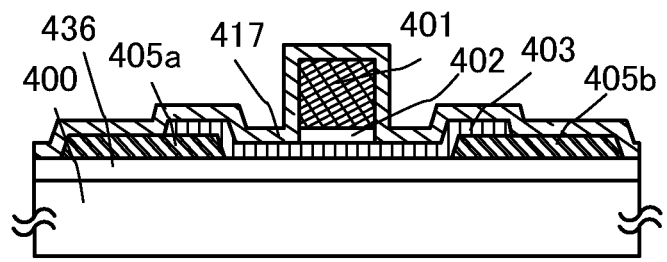
FIGS. 5A to 5D show one embodiment of a semiconductor device and a manufacturing method of the semiconductor device.

FIG. 5A corresponds to FIG. 4C, in which a source electrode layer 405a, a drain electrode layer 405b, an oxide semiconductor film 403, a gate insulating film 402, a gate electrode layer 401, and a film 417 including a metal element are formed over a substrate 400 having an insulating surface over which an insulating film 436 is provided.

In this embodiment, a 10-nm-thick aluminum film is formed by a sputtering method as the film 417 including the metal element.

Next, heat treatment is performed in the state where the film 417 including the metal element is in contact with part of the oxide semiconductor film 403. The heat treatment is preferably performed under an oxygen atmosphere.

For example, the substrate is put into an electric furnace which is one of heat treatment apparatuses, and heat treatment is performed on the film 417 including the metal element and the oxide semiconductor film 403 at 300° C. for 1 hour in an oxygen atmosphere.

Figure 5B:
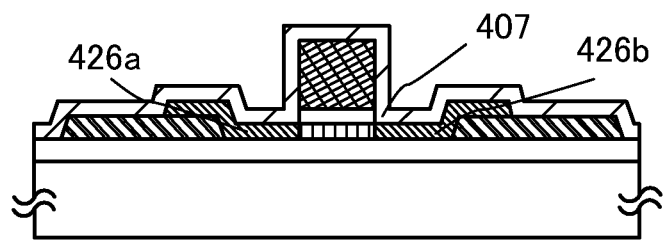

By the heat treatment, the metal element is added to the oxide semiconductor film 403 from the film 417 including the metal element, so that low-resistance regions 426a and 426b are formed (see FIG. 5B). The low-resistance regions 426a and 426b include the metal element.

The film 417 including the metal element is turned into a film 407 including a metal element by the heat treatment for adding the metal element from the film 417 including the metal element to the oxide semiconductor film 403. For example, a metal film used as the film 417 including the metal element is turned into a metal oxide insulating film as the film 407 including the metal element. Such a metal oxide film can be used as an insulating film. In this embodiment, the aluminum film used as the film 417 including the metal element is turned into an aluminum oxide film by the heat treatment. The aluminum oxide film, which is a metal oxide insulating film, can be used as an insulating film.

Next, a dopant 421 is selectively added to the oxide semiconductor film 403 through the film 407 including the metal element, the source electrode layer 405a, and the drain electrode layer 405b with the gate insulating film 402 and the gate electrode layer 401 used as a mask, so that low-resistance regions 404a and 404b are formed.

In this embodiment, phosphorus is used as the dopant 421, whose ion is added by an ion implantation method.

In this manner, the low-resistance regions 404a and 404b including the dopant and the metal element are formed to sandwich a channel formation region 409 in the oxide semiconductor film 403. The resistance of the low-resistance regions 404a and 404b can be low.

Figure 5C:
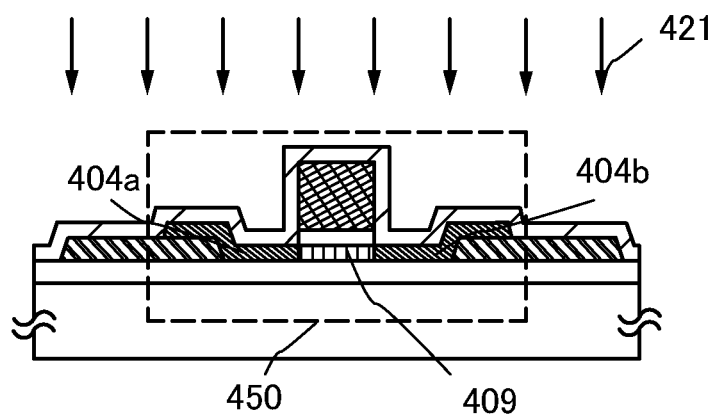
Figure 5D:
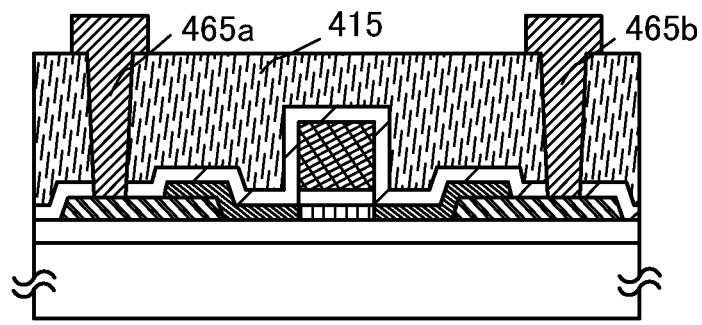

Through the above process, the transistor 450 of this embodiment can be manufactured (see FIG. 5C). With the oxide semiconductor film 403 including the low-resistance regions 404a and 404b with the channel formation region 409 provided therebetween in the channel length direction, on-state characteristics (e.g., on-state current and field-effect mobility) of the transistor 450 are increased, which enables high-speed operation and high-speed response of the transistor 450.

The low-resistance regions 404a and 404b each can be functioned as a source region or a drain region. With the low-resistance regions 404a and 404b, the electric field applied to the channel formation region 409 between the low-resistance regions 404a and 404b can be relaxed. Further, electrical connection between the oxide semiconductor film 403 and each of the source electrode layer 405a and the drain electrode layer 405b in the low-resistance regions 404a and 404b can reduce the contact resistance between the oxide semiconductor film 403 and each of the source electrode layer 405a and the drain electrode layer 405b.

In this embodiment, a planarization insulating film 415 is formed over the film 407 including the metal element. Further, an opening reaching the source electrode layer 405a and an opening reaching the drain electrode layer 405b are formed in the film 407 including the metal element and the planarization insulating film 415, and a wiring layer 465a and a wiring layer 465b which are electrically connected to the source electrode layer 405a and the drain electrode layer 405b respectively are formed in the openings (see FIG. 5D).

In this manner, by using the transistor whose electric characteristics are good, a high-performance, highly reliable semiconductor device can be provided.

This embodiment can be implemented combining with any other embodiment as appropriate.

Embodiment 5

In this embodiment, another embodiment of a semiconductor device and a method for manufacturing the semiconductor device is described with reference to FIGS. 8A to 8F. The above embodiment can be applied to the same portion as, a portion having a function similar to, or a step similar to that in the above embodiment; thus, repetitive description is omitted. In addition, detailed description of the same portions is also omitted.

In this embodiment, an example of a bottom-gate transistor is described. A transistor 410 shown in FIGS. 8A to 8F is a kind of bottom-gate structure referred to as a channel-protective type (also called channel-stop type) and is also referred to as an inverted staggered transistor.

FIGS. 8A to 8F illustrate an example of a method for manufacturing the transistor 410.

First, a conductive film is formed over a substrate 400 having an insulating surface, and then, a gate electrode layer 401 is formed by a first photolithography process.

A gate insulating film 402 is formed over the gate electrode layer 401. Then, an oxide semiconductor film 403 is formed over the gate electrode layer 401 and the gate insulating film 402.

Figure 8A:
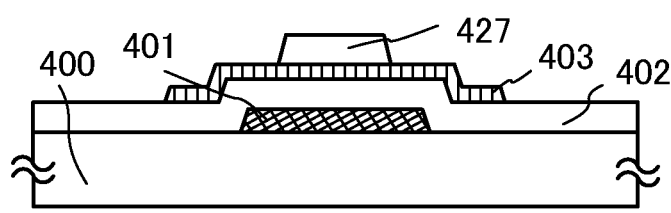
FIGS. 8A to 8F show one embodiment of a semiconductor device and a manufacturing method of the semiconductor device.

An insulating film 427 serving as a channel protection film is formed over the oxide semiconductor film 403 to overlap with the gate electrode layer 401 (see FIG. 8A).

The insulating film 427 may be formed using a material and a method similar to those of an insulating film 416; as a typical example, a single layer or a stacked layer using one or more of inorganic insulating films such as a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film can be used.

When the insulating film 427 in contact with the oxide semiconductor film 403 (or a film in contact with the oxide semiconductor film 403 in the case where the insulating film 427 has a stacked-layer structure) contains much oxygen, the insulating film 427 (or the film in contact with the oxide semiconductor film 403) can favorably function as a supply source which supplies oxygen to the oxide semiconductor film 403.

Figure 8B:
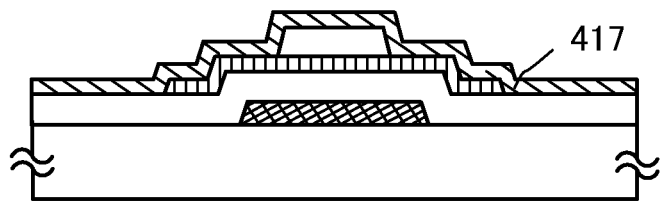

Next, a film 417 including a metal element is formed over the gate electrode layer 401, the gate insulating film 402, the oxide semiconductor film 403, and the insulating film 427 to be in contact with part of the oxide semiconductor film 403 (see FIG. 8B).

In this embodiment, a 10-nm-thick aluminum film is formed by a sputtering method as the film 417 including the metal element.

Figure 8C:
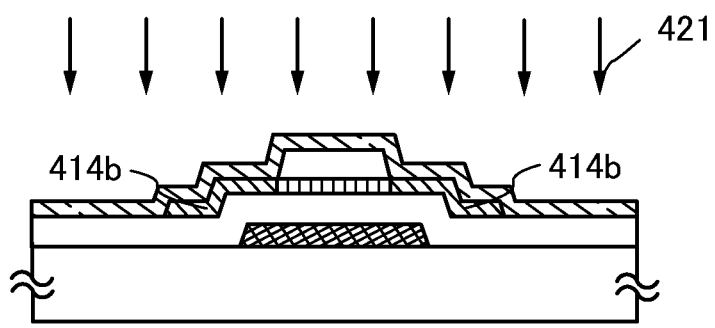

Next, a dopant 421 is selectively added to the oxide semiconductor film 403 through the film 417 including the metal element with the gate insulating film 402 and the gate electrode layer 401 as a mask, so that low-resistance regions 414a and 414b are formed (see FIG. 8C).

Although the insulating film 427 serving as the channel protective film is used as a mask for the addition of the dopant 421 in this embodiment, a resist mask may be formed for selective addition of the dopant 421. Also in a channel-etched transistor in which a channel protective film is not provided, a resist mask may be formed for selective addition of a dopant.

In this embodiment, boron is used as the dopant 421, whose ion is added to the oxide semiconductor film 403 by an ion implantation method.

The concentration of the dopant 421 in the low-resistance region is preferably greater than or equal to $5 \times 10^{18}$ atoms/cm$^3$ and less than or equal to $1 \times 10^{22}$ atoms/cm$^3$.

Heat treatment may be performed thereon after the addition of the dopant 421.

Next, heat treatment is performed in the state where the film 417 including the metal element and the oxide semiconductor film 403 are partly in contact with each other. The heat treatment is preferably performed under an oxygen atmosphere.

For example, the substrate is put in an electric furnace which is one of heat treatment apparatuses, and heat treatment is performed on the film 417 including the metal element and the oxide semiconductor film 403 at 300° C. for 1 hour in an oxygen atmosphere.

Through the heat treatment, the metal element is added to the oxide semiconductor film 403 from the film 417 including the metal element, so that low-resistance regions 404a and 404b are formed. Accordingly, the low-resistance regions 404a and 404b including the dopant and the metal element are formed in the oxide semiconductor film 403 to sandwich a channel formation region 409 therebetween. The resistance of the low-resistance regions 404a and 404b including the dopant and the metal element can be low.

In this embodiment, boron is used as the dopant and aluminum is used as the metal element, and therefore the low-resistance regions 404a and 404b contain boron and aluminum.

Figure 8D:
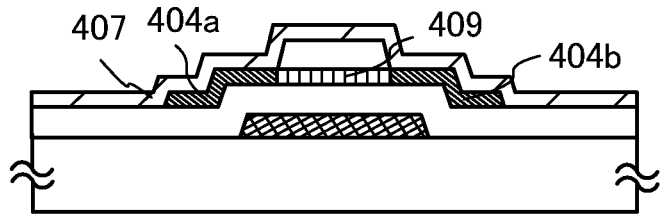

The heat treatment for adding the metal element from the film 417 including the metal element to the oxide semiconductor film 403 makes the film 417 including the metal element a film 407 including a metal element (see FIG. 8D).

Next, the film 407 including the metal element is removed, and a source electrode layer 405a and a drain electrode layer 405b are formed in contact with the low-resistance regions 404a and 404b, respectively. In the case where the film 407 including the metal element has a conductive property, the film 407 including the metal element may not be removed and may be etched by using the source electrode layer 405a and the drain electrode layer 405b as a mask, so that the remaining film 407 including the metal element is used as parts of the source electrode layer 405a and the drain electrode layer 405b.

Figure 8E:
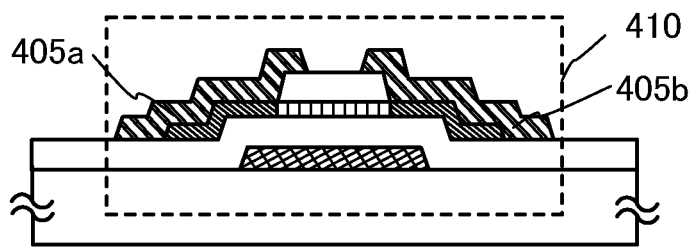

Through the above-described process, the transistor 410 of this embodiment can be manufactured (see FIG. 8E). With the oxide semiconductor film 403 including the low-resistance regions 404a and 404b between which the channel formation region 409 is provided in the channel length direction, on-state characteristics (e.g., on-state current and field-effect mobility) of the transistor 410 are increased, which enables high-speed operation and high-speed response of the transistor.

The low-resistance regions 404a and 404b each can be functioned as a source region or a drain region. With the low-resistance regions 404a and 404b, the electrical field applied to the channel formation region 409 formed between the low-resistance regions 404a and 404b can be relaxed. Further, electrical connection between the oxide semiconductor film 403 and each of the source electrode layer 405a and the drain electrode layer 405b in the low-resistance regions 404a and 404b, respectively, can reduce the contact resistance between the oxide semiconductor film 403 and each of the source electrode layer 405a and the drain electrode layer 405b.

Figure 8F:
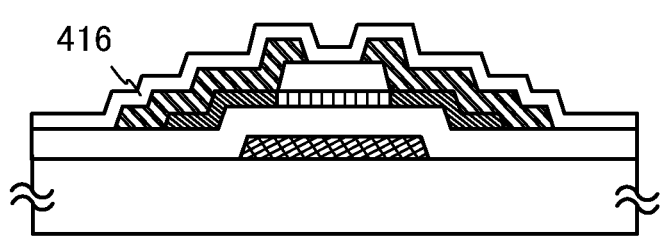

In this embodiment, a planarization insulating film 416 is formed as a protective film over the transistor 410 (see FIG. 8F).

In this manner, by using the transistor whose electric characteristics are good, a high-performance, highly reliable semiconductor device can be provided.

This embodiment can be implemented combining with any other embodiment as appropriate.

Embodiment 6

In this embodiment, another embodiment of a method for manufacturing a semiconductor device is described. The above embodiment can be applied to the same portion as, a portion having a function similar to, or a step similar to that in the above embodiment; thus, repetitive description is omitted. In addition, detailed description of the same portions is also omitted.

This embodiment can be applied to any of the transistors 440, 445, 420a, 420b, 450, and 410 described in Embodiments 1 to 5.

Described in this embodiment is an example in which in a method for manufacturing a transistor according to one embodiment of the present invention, oxygen (which includes at least one of an oxygen radical, an oxygen atom, and an oxygen ion) is added to a semiconductor film 403 to supply oxygen to the film after the semiconductor film 403 is dehydrated or dehydrogenated.

The dehydration or dehydrogenation treatment may accompany elimination of oxygen which is a main constituent material of an oxide semiconductor to lead to a reduction in oxygen. An oxygen vacancy exists in a portion where oxygen is eliminated in the oxide semiconductor film 403, and a donor level which leads to a change in the electric characteristics of a transistor is formed owing to the oxygen vacancy.

Thus, oxygen is preferably supplied to the oxide semiconductor film 403 after being subjected to the dehydration or dehydrogenation treatment. By supply of oxygen to the oxide semiconductor film 403, oxygen vacancies in the film can be repaired. Accordingly, the use of the oxide semiconductor film for the transistor can lead to a reduction in a variation in the threshold voltage Vth of the transistor and a shift of the threshold voltage ($\Delta$Vth) due to an oxygen vacancy. Further, the threshold voltage of the transistor can be shifted in the positive direction to make the transistor a normally-off transistor.

Although an example in which oxygen is added to the oxide semiconductor film 403 is described in this embodiment, oxygen may be added to the gate insulating film 402, the gate insulating film 442, the insulating film 436, the film 407 including the metal element, the insulating film 416, the insulating film 427, or the like which is in contact with the oxide semiconductor film 403. The addition of oxygen into the gate insulating film 402, the gate insulating film 442, the insulating film 436, the film 407 including the metal element, the insulating film 416, the insulating film 427, or the like which is in contact with the oxide semiconductor film 403 to make the film an oxygen-excess film enables oxygen to be supplied to the oxide semiconductor film 403.

As the method for addition of oxygen, an ion implantation method, an ion doping method, a plasma immersion ion implantation method, plasma treatment, or the like can be used.

In the step of addition of oxygen, oxygen may be directly added to the oxide semiconductor film 403 or added to the oxide semiconductor film through another film such as the gate insulating film or an insulating film. An ion implantation method, an ion doping method, a plasma immersion ion implantation method, or the like may be employed for the addition of oxygen through another film, whereas plasma treatment or the like can also be employed for the addition of oxygen directly into an exposed oxide semiconductor film.

The addition of oxygen into the oxide semiconductor film 403 can be performed on the exposed oxide semiconductor film 403 after formation of the source electrode layer 405a and the drain electrode layer 405b, after formation of the gate insulating film 442 or the gate insulating film 402, after formation of the gate electrode layer 401, after formation of the film 417 including the metal element, after formation of the film 407 including the metal element, after formation of the insulating film 416, or after formation of the planarization insulating film 415 in the transistors 440, 445, 420a, 420b, and 450.

The addition of oxygen into the oxide semiconductor film 403 can be performed on the exposed oxide semiconductor film 403 after formation of the insulating film 427, after formation of the film 417 including the metal element, after formation of the film 407 including the metal element, after formation of the source electrode layer 405a and the drain electrode layer 405b, or after formation of the insulating film 416 in the transistor 410.

As described above, the addition of oxygen into the oxide semiconductor film can be performed anytime after dehydration or dehydrogenation treatment is performed thereon. Further, oxygen may be added plural times into the dehydrated or dehydrogenated oxide semiconductor film.

For example, it is preferable that the concentration of oxygen in the oxide semiconductor film 403, which is added by the addition of oxygen, be greater than or equal to $1\times10^{18}$ atoms/cm$^3$ and less than or equal to $5\times10^{21}$ atoms/cm$^3$.

In the oxide semiconductor, oxygen is one of main constituent materials. Thus, it is difficult to accurately estimate the oxygen concentration of the oxide semiconductor film by a method such as secondary ion mass spectrometry (SIMS). In other words, it can be said that it is difficult to determine whether oxygen is intentionally added to the oxide semiconductor film.

It is known that there exist isotopes of oxygen, such as $^{17}O$ and $^{18}O$, and $^{17}O$ and $^{18}O$ account for about 0.037% and about 0.204% of all of the oxygen atoms in nature, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes. Thus, the concentrations of these isotopes may be measured to determine whether oxygen is intentionally added to the oxide semiconductor film.

In the case where oxygen is directly added to the oxide semiconductor film as in this embodiment, the insulating film which is in contact with the oxide semiconductor film does not necessarily contain much oxygen. Needless to say, oxygen may be supplied by a plurality of methods: for example, oxygen may be supplied both by using a film containing much oxygen as the insulating film in contact with the oxide semiconductor film, and by direct addition of oxygen into the oxide semiconductor film.

A film having a high shielding effect (blocking effect) against oxygen, hydrogen, and impurities containing hydrogen such as water is preferably provided as the insulating film covering the oxide semiconductor film so that oxygen added to the oxide semiconductor film is not eliminated from the oxide semiconductor film and hydrogen and impurities containing hydrogen such as water do not enter the oxide semiconductor film. For example, an aluminum oxide film or the like having a high shielding effect (blocking effect) against both of oxygen and impurities such as hydrogen and moisture may be used.

Heat treatment is preferably performed after oxygen is added to the oxide semiconductor film.

Oxygen which is added to the dehydrated or dehydrogenated oxide semiconductor film to supply oxygen to the film can highly purify the oxide semiconductor film and make the film an electrically i-type (intrinsic).

Change in the electric characteristics of the transistor including the highly purified and electrically i-type (intrinsic) oxide semiconductor film is suppressed and the transistor is thus electrically stable.

In this manner, a semiconductor device using an oxide semiconductor whose electric characteristics are stable can be provided. Accordingly, a highly reliable semiconductor device can be provided.

This embodiment can be implemented combining with any other embodiment as appropriate.

Embodiment 7

A semiconductor device (also referred to as a display device) having a display function can be manufactured using the transistor an example of which is described in any of Embodiments 1 to 6. Moreover, part or all of the driver circuitry which includes the transistor can be formed over a substrate where a pixel portion is formed, whereby a system-on-panel can be formed.

Figure 9A:
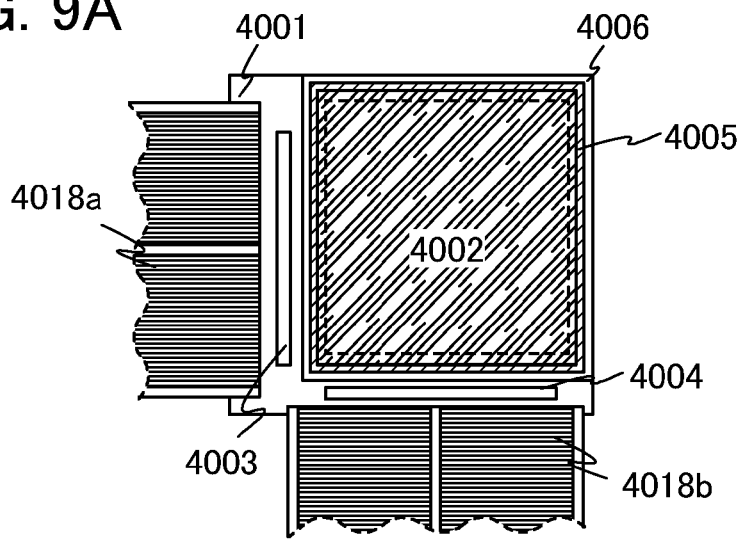
FIGS. 9A to 9C each show one embodiment of a semiconductor device.

In FIG. 9A, a sealant 4005 is provided so as to surround a pixel portion 4002 provided over a first substrate 4001, and the pixel portion 4002 is sealed with a second substrate 4006. In FIG. 9A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018a and 4018b.

Figure 9B:
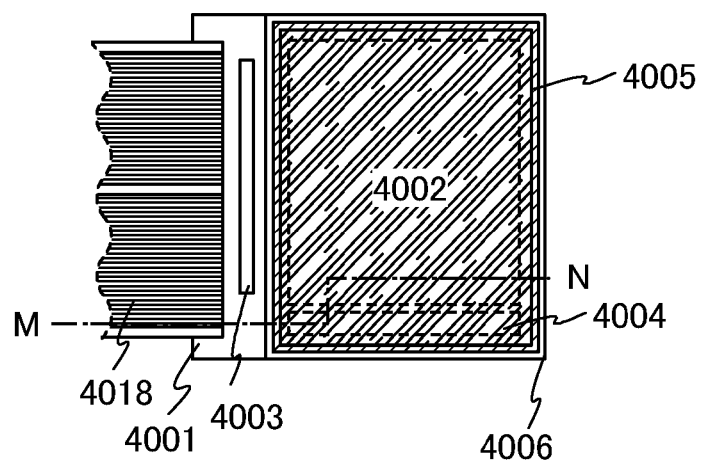
Figure 9C:
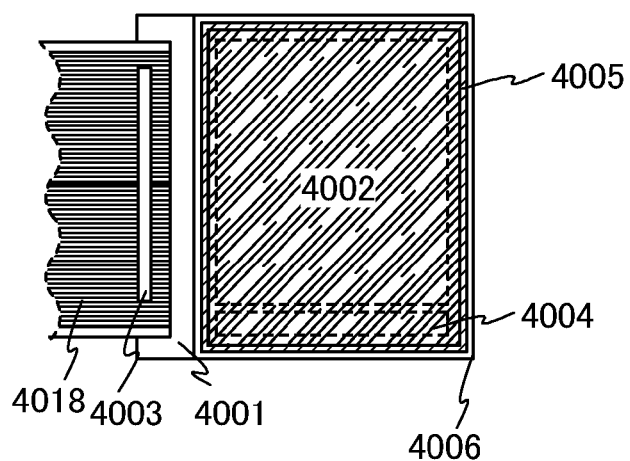

In FIGS. 9B and 9C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 9B and 9C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 9B and 9C, a variety of signals and potentials are supplied to the signal line driver circuit 4003, the scan line driver circuit 4004, and the pixel portion 4002 from an FPC 4018.

Although FIGS. 9B and 9C each illustrate an example in which the signal line driver circuit 4003 is formed separately and mounted over the first substrate 4001, embodiments of the present invention are not limited to this structure. The scan line driver circuit may be formed separately and then mounted, or only part of the signal line driver circuit or only part of the scan line driver circuit may be formed separately and then mounted.

The connection method of such a separately formed driver circuit is not particularly limited; for example, a chip on glass (COG) method, a wire bonding method, or a tape automated bonding (TAB) method can be used. FIG. 9A illustrates an example in which the signal line driver circuit 4003 and the scan line driver circuit 4004 are mounted by a COG method; FIG. 9B illustrates an example in which the signal line driver circuit 4003 is mounted by a COG method; and FIG. 9C illustrates an example in which the signal line driver circuit 4003 is mounted by a TAB method.

The display device includes in its category a panel in which a display element is sealed, and a module in which an IC such as a controller or the like is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in Embodiments 1 to 6 can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically includes an inorganic electroluminescent (EL) element, an organic EL element, and the like. A display medium whose contrast is changed by an electric effect, such as electronic ink, can also be used.

An embodiment of a semiconductor device is described with reference to FIGS. 9A to 9C and FIGS. 10A and 10B. FIGS. 10A and 10B are cross-sectional diagrams taken along line M-N of FIG. 9A.

As shown in FIGS. 9A to 9C and FIGS. 10A and 10B, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

Each of the pixel portion 4002 and the scan line driver circuit 4004 which are provided over the first substrate 4001 includes a plurality of transistors. In FIGS. 9A to 9C and FIGS. 10A and 10B, the transistor 4010 included in the pixel portion 4002 and the transistor 4011 included in the scan line driver circuit 4004 are illustrated as an example. An insulating film 4020 is provided over the transistors 4010 and 4011 in FIG. 10A, and an insulating film 4021 is further provided in FIG. 10B. An insulating film 4023 is an insulating film serving as a base film.

Any of the transistors described in Embodiments 1 to 6 can be applied to the transistors 4010 and 4011. In this embodiment, an example in which a transistor having a structure similar to that of the transistor 440 described in Embodiment 1 is used is described.

The transistors 4010 and 4011 are transistors including an oxide semiconductor film including low-resistance regions between which a channel formation region is provided in the channel length direction. Accordingly, on-state characteristics (e.g., on-state current and field-effect mobility) of the transistors 4010 and 4011 are increased, which enables high-speed operation and high-speed response of the transistors. Further, the transistors 4010 and 4011 can be miniaturized.

Accordingly, a high-performance, highly reliable semiconductor device can be provided as the semiconductor device of this embodiment illustrated in FIGS. 9A to 9C and FIGS. 10A and 10B.

The transistor 4010 included in the pixel portion 4002 is electrically connected to a display element to constitute a part of a display panel. There is no particular limitation on the kind of the display element as long as display can be performed, and various kinds of display elements can be used.

An example of a liquid crystal display device using a liquid crystal element as a display element is illustrated in FIG. 10A. In FIG. 10A, a liquid crystal element 4013 which is a display element includes a first electrode layer 4030, a second electrode layer 4031, and a liquid crystal layer 4008. Insulating films 4032 and 4033 serving as orientation films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A columnar spacer denoted by reference numeral 4035 is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal layer 4008. The blue phase is one of liquid crystal phases, which is generated just before a cholesteric phase changes into an isotropic phase while temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, so that the alignment process is not requisite and the viewing angle dependence is small. In addition, since an alignment film does not need to be provided and thus rubbing treatment is not requisite, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor using an oxide semiconductor film.

The specific resistivity of the liquid crystal material is greater than or equal to $1 \times 10^9$ $\Omega \cdot$cm, preferably greater than or equal to $1 \times 10^{11}$ $\Omega \cdot$cm, further preferably greater than or equal to $1 \times 10^{12}$ $\Omega \cdot$cm. The specific resistivity in this specification is measured at 20° C.

The magnitude of a storage capacitor in the liquid crystal display device is set considering the leakage current of the transistor in the pixel portion or the like so that charge can be held for a predetermined period. The magnitude of the storage capacitor may be set considering the off-state current of the transistor or the like. By using the/a transistor including an oxide semiconductor film disclosed in this specification, a capacitance that is ⅓ or less, preferably ⅕ or less of liquid crystal capacitance of each pixel is enough as the magnitude of the storage capacitor.

In the transistor using an oxide semiconductor film disclosed in this specification, the current in an off state (off-state current) can be suppressed to be small. Accordingly, an electric signal such as an image signal can be held for a longer period, and a writing interval can be set longer in an on state. The frequency of refresh operation can be accordingly reduced, which leads to an effect of suppressing power consumption.

Further, the transistor using an oxide semiconductor film disclosed in this specification can exhibit a high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided. Accordingly, reliability of the semiconductor device can also be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode; for example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Embodiments of the disclosed invention are not limited to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to the ground state from the excited state, thereby emitting light. This light-emitting element is called a current-excitation light-emitting element after such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An organic EL element is used as the light-emitting element for description here.

To extract light emitted from the light-emitting element, it is necessary that at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side; a light-emitting element having any of these emission structures can be used.

An example of a light-emitting device in which a light-emitting element is used as a display element is illustrated in FIG. 10B. A light-emitting element 4513 which is the display element is electrically connected to the transistor 4010 provided in the pixel portion 4002. A structure of the light-emitting element 4513 is not limited to the shown stacked-layer structure, which is the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 is formed using an organic insulating material or an inorganic insulating material. It is preferable that the partition wall 4510 be formed using a photosensitive resin material and have an opening over the first electrode layer 4030 so that a sidewall of the opening is formed as a tilted surface with continuous curvature.

The electroluminescent layer 4511 has either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

Further, electronic paper in which electronic ink is driven can be provided as the display device. The electronic paper is also called electrophoretic display device (electrophoretic display) and is advantageous in that it exhibits the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particles and the second particles each contain a pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Further, by using a color filter or particles that have a pigment, color display can also be achieved.

The first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 9A to 9C and FIGS. 10A and 10B, a flexible substrate as well as a glass substrate can be used as any of the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

In this embodiment, an aluminum oxide film, a metal oxide insulating film which is obtained by performing heat treatment on a film including a metal element is used as the insulating film 4020.

The aluminum oxide film which is provided as the insulating film 4020 over the oxide semiconductor film has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

The insulating film 4021 serving as a planarization insulating film can be formed using an organic material having heat resistance, such as acrylic, polyimide, benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from the light source or the display element. Therefore, the substrate and the thin films such as the insulating film and the conductive film provided for the pixel portion where light is transmitted have light-transmitting properties with respect to light in the visible light wavelength range.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the first electrode layer 4030 and the second electrode layer 4031. As the conductive high molecule, a so-called $\pi$-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is likely to be broken owing to static electricity or the like, a protection circuit for protecting the driver circuit is preferably provided. The protection circuit is preferably formed using a nonlinear element.

Any of the transistors described in Embodiments 1 to 6 as described above enables semiconductor devices having a variety of functions to be provided.

Embodiment 8

Any of the transistors described in Embodiments 1 to 6 enables a semiconductor device having an image sensor function of reading data on an object to be manufactured.

Figure 11A:
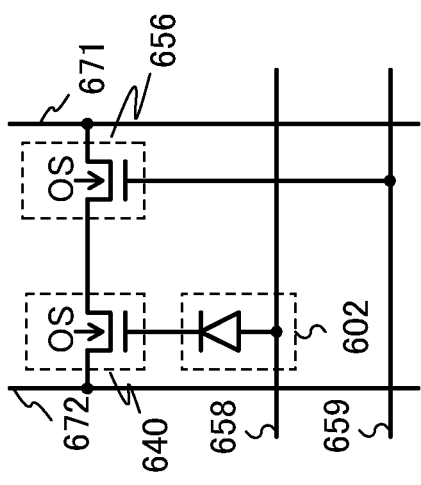
FIGS. 11A and 11B show one embodiment of a semiconductor device.

FIG. 11A illustrates an example of a semiconductor device having an image sensor function. FIG. 11A is an equivalent circuit diagram of a photosensor, and FIG. 11B is a cross-sectional diagram of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

In the circuit diagrams in this specification, symbol "OS" is written under the mark of a transistor using an oxide semiconductor film so that it can be clearly identified as a transistor using an oxide semiconductor film. In FIG. 11A, the transistor 640 and the transistor 656 are transistors each using an oxide semiconductor layer, to which any of the transistors described in Embodiments 1 to 6 can be applied. Described in this embodiment is an example in which a transistor having a structure similar to that of the transistor 440 described in Embodiment 1 is used.

Figure 11B:
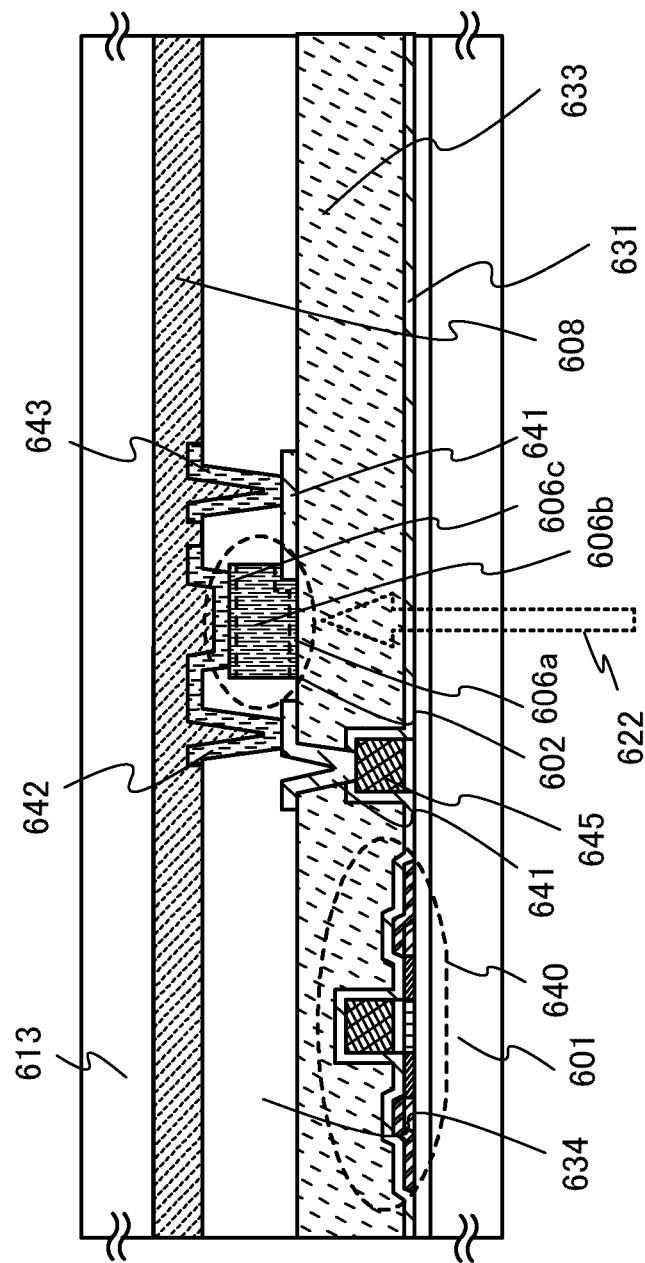

FIG. 11B is a cross-sectional diagram of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma-enhanced CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like may be performed after the impurity element is added by an ion implantation method or the like to diffuse the impurity element. In that case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma-enhanced CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma-enhanced CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be added to the amorphous silicon film by a diffusion method or an ion implantation method. Heating or the like may be performed after the impurity element is added by an ion implantation method or the like to diffuse the impurity element. In that case, as the method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that the stability is increased and thus a favorable microcrystalline semiconductor film can be obtained.

This microcrystalline semiconductor film can be formed by a radio-frequency plasma-enhanced CVD method with a frequency of greater than or equal to several tens of megahertz and less than or equal to several hundreds of megahertz, or a microwave plasma-enhanced CVD apparatus with a frequency of greater than or equal to 1 GHz. As a typical example, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive film. A surface on the n-type semiconductor film side can alternatively be used as the light-receiving plane.

With the use of an insulating material, the interlayer insulating film 633 and the interlayer insulating film 634 can be formed, depending on the material, by a method or a tool (equipment) such as a sputtering method, a plasma-enhanced CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film, which is a metal oxide insulating film obtained by performing heat treatment on a film including a metal element, is used as the insulating film 631. The insulating film 631 can be formed by a sputtering method or a plasma-enhanced CVD method.

The aluminum oxide film which is provided as the insulating film 631 over the oxide semiconductor film has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film and release of oxygen, which is a main constituent material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. A light source such as a backlight can be used at the time of reading data on the object.

Accordingly, on-state characteristics (e.g., on-state current and field-effect mobility) of the transistor including an oxide semiconductor film including low-resistance regions between which a channel formation region is provided in the channel length direction are increased, which enables high-speed operation and high-speed response of the transistor. Further, the transistor can be miniaturized. Accordingly, by using the transistor, a high-performance, highly reliable semiconductor device can be provided.

This embodiment can be implemented combining with any structure described in any other embodiment as appropriate.

Embodiment 9

The transistor an example of which is described in any of Embodiments 1 to 6 can be favorably used for a semiconductor device including an integrated circuit in which a plurality of transistors is stacked. In this embodiment, as an example of the semiconductor device, a memory medium (memory element) is described.

Manufactured in this embodiment is a semiconductor device which includes a transistor 140 which is a first transistor formed using a single crystal semiconductor substrate and a transistor 162 which is a second transistor formed using a semiconductor film and provided above the transistor 140 with an insulating film provided therebetween. The transistor an example of which is described in any of Embodiments 1 to 6 can be favorably used as the transistor 162. Described in this embodiment is an example in which a transistor having a structure similar to that of the transistor 440 described in Embodiment 1 is used as the transistor 162.

Semiconductor materials and structures of the transistor 140 and the transistor 162, which are stacked, may be the same as or different from each other. In this embodiment, an example is described in which materials and structures which are appropriate for the circuit of the memory medium (memory element) are employed for the transistors.

Figure 12A:
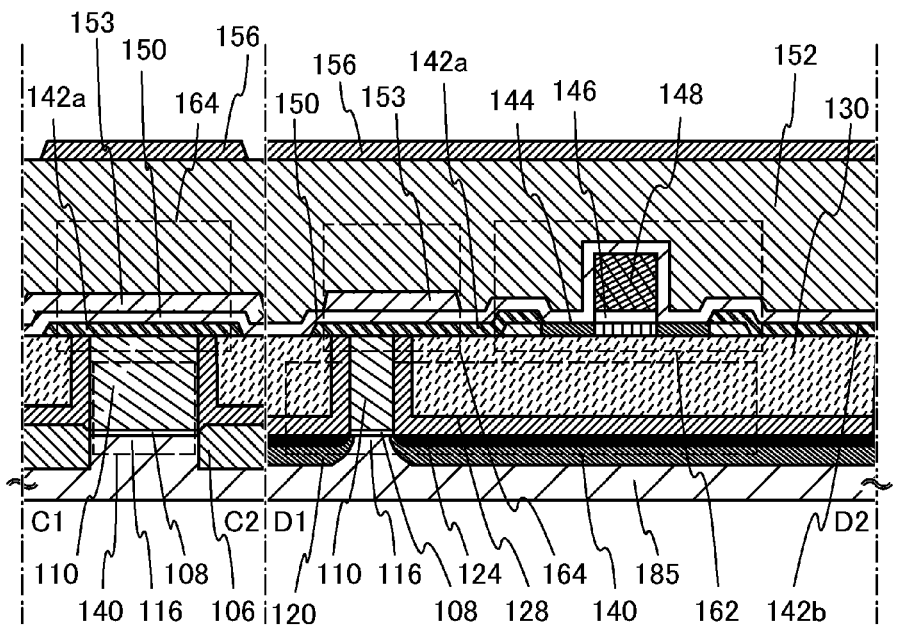
FIGS. 12A to 12C show one embodiment of a semiconductor device.
Figure 12B:
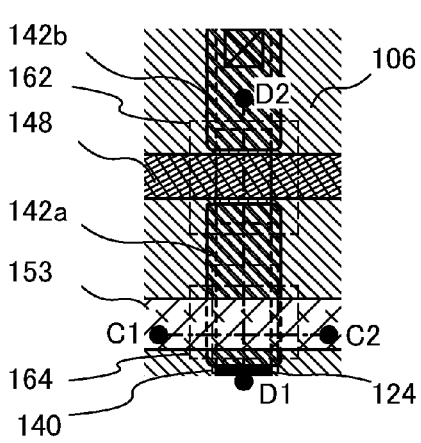
Figure 12C:
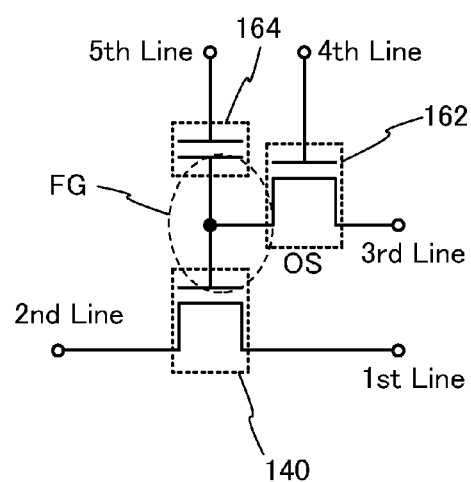

In FIGS. 12A to 12C, an example of the structure of the semiconductor device is illustrated. FIG. 12A illustrates a cross section of the semiconductor device, and FIG. 12B is a top view of the semiconductor device. Here, FIG. 12A corresponds to a cross section along line C1-C2 and line D1-D2 in FIG. 12B. In addition, FIG. 12C is an example of a diagram of a circuit using the semiconductor device as a memory element. The semiconductor device illustrated in FIGS. 12A and 12B includes the transistor 140 using a first semiconductor material in a lower portion, and the transistor 162 using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor using such a semiconductor material can operate at high speed easily. On the other hand, a transistor using an oxide semiconductor enables charge to be held for a long time owing to its characteristics.

A method for manufacturing the semiconductor device in FIGS. 12A to 12C is described with reference to FIGS. 12A to 12C.

The transistor 140 includes a channel formation region 116 provided in a substrate 185 containing a semiconductor material (e.g., silicon), impurity regions 120 provided so that the channel formation region 116 is positioned therebetween, metal compound regions 124 in contact with the impurity regions 120, a gate insulating film 108 provided over the channel formation region 116, and a gate electrode 110 provided over the gate insulating film 108.

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Although the "SOI substrate" generally means a substrate in which a silicon semiconductor film is provided on an insulating surface, the "SOI substrate" in this specification and the like also includes in its category a substrate in which a semiconductor film formed using a material other than silicon is provided on an insulating surface. That is, a semiconductor film included in the "SOI substrate" is not limited to a silicon semiconductor film. Moreover, the SOI substrate can have a structure in which a semiconductor film is provided over an insulating substrate such as a glass substrate with an insulating film provided therebetween.

As a method of forming the SOI substrate, any of the following methods can be used: a method in which oxygen ions are added to a mirror-polished wafer and then heating is performed thereon at a high temperature, whereby an oxide layer is formed at a certain depth from a top surface of the wafer and a defect caused in the surface layer is eliminated; a method in which a semiconductor substrate is separated by utilizing growth of microvoids formed by hydrogen ion irradiation, by heat treatment; a method in which a single crystal semiconductor film is formed over an insulating surface by crystal growth; and the like.

For example, ions are added through one surface of a single crystal semiconductor substrate, so that an embrittlement layer is formed at a certain depth from a surface of the single crystal semiconductor substrate, and an insulating film is formed over one of the surface of the single crystal semiconductor substrate and an element substrate. Heat treatment is performed in a state where the single crystal semiconductor substrate and the element substrate are bonded to each other with the insulating film provided therebetween, so that a crack is generated in the embrittlement layer and the single crystal semiconductor substrate is separated along the embrittlement layer. Accordingly, a single crystal semiconductor layer, which is separated from the single crystal semiconductor substrate, is formed as a semiconductor layer over the element substrate. An SOI substrate formed by the above method can also be favorably used.

An element isolation insulating layer 106 is provided over the substrate 185 so as to surround the transistor 140. For high integration, it is preferable that, as in FIGS. 12A to 12C, the transistor 140 do not include a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 formed using a single crystal semiconductor substrate can operate at high speed. Thus, the use of the transistor as a reading transistor enables data to be read at high speed. Two insulating films are formed so as to cover the transistor 140. As treatment prior to formation of the transistor 162 and a capacitor 164, CMP treatment is performed on the two insulating films, so that an insulating film 128 and an insulating film 130 are formed to be planarized and an upper surface of the gate electrode 110 is exposed.

As each of the insulating film 128 and the insulating film 130, as a typical example, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma-enhanced CVD method, a sputtering method, or the like.

Alternatively, an organic material such as a polyimide, acrylic, or benzocyclobutene-based resin can be used. Other than such organic materials, it is also possible to use a low dielectric constant material (low-k material) or the like. In the case of using an organic material, the insulating film 128 and the insulating film 130 may be formed by a wet method such as a spin coating method or a printing method.

In the insulating film 130, a silicon oxide film is used as the film to be in contact with the semiconductor film.

In this embodiment, a 50-nm-thick silicon oxynitride film is formed as the insulating film 128 by a sputtering method, and a 550-nm-thick silicon oxide film is formed as the insulating film 130 by a sputtering method.

The semiconductor film is formed over the insulating film 130 which is sufficiently planarized by the CMP. In this embodiment, an oxide semiconductor film is formed, for example, by a sputtering method with the use of an In—Ga—Zn—O-based oxide target.

Next, the oxide semiconductor film is selectively etched to form an island-shaped oxide semiconductor film 144. Over the oxide semiconductor film 144, a source and drain electrodes 142a and 142b are formed.

Over the oxide semiconductor film, a gate insulating film 146 and a gate electrode layer 148 are formed. The gate electrode layer 148 can be formed by forming a conductive layer and selectively etching the conductive layer. The gate insulating film 146 is formed by etching an insulating film with the gate electrode layer 148 as a mask.

For the gate insulating film 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma-enhanced CVD method, a sputtering method, or the like.

The conductive layers which can be used for the gate electrode 110 and the source and drain electrodes 142a and 142b can be formed by a PVD method such as a sputtering method or a CVD method such as a plasma-enhanced CVD method. Further, as a material of the conductive layers, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive layer may have a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. A conductive layer having a single-layer structure of a titanium film or a titanium nitride film has an advantage in that it can be easily processed into the source and drain electrodes 142a and 142b having a tapered shape.

Next, a film including a metal element is formed in contact with the oxide semiconductor film 144 over the oxide semiconductor film 144, the gate insulating film 146, and the gate electrode layer 148. An aluminum film is formed as the film including the metal element in this embodiment.

A dopant (boron in this embodiment) is added to the oxide semiconductor film 144 through the film including the metal element, and heat treatment is performed in the state where the oxide semiconductor film 144 including the dopant and the film including the metal element are in contact with each other. With the heat treatment, the metal element is added to the oxide semiconductor film 144 from the film including the metal element, so that low-resistance regions including the dopant and the metal element are formed in the oxide semiconductor film 144. In this manner, the transistor 162 including the oxide semiconductor film 144 including the low-resistance regions including the dopant and the metal element between which the channel formation region is provided can be manufactured.

With the oxide semiconductor film 144 including the low-resistance regions between which the channel formation region is provided in the channel length direction, on-state characteristics (e.g., on-state current and field-effect mobility) of the transistor 162 are increased, which enables high-speed operation and high-speed response of the transistor.

The low-resistance regions each can be functioned as a source region or a drain region. With the low-resistance regions, the electrical field applied to the channel formation region formed between the low-resistance regions can be relaxed. Further, electrical connection between the oxide semiconductor film 144 and each of the source and drain electrodes 142a and 142b in the low-resistance regions, can reduce the contact resistance between the oxide semiconductor film 144 and each of the source and drain electrodes 142a and 142b.

The film including the metal element is turned into a film 150 including a metal element by the heat treatment for adding the metal element from the film including the metal element. For example, a metal film used as the film including the metal element is turned into a metal oxide insulating film as the film 150 including the metal element. Such a metal oxide film can be used as an insulating film. In this embodiment, the aluminum film used as the film including the metal element is turned into an aluminum oxide film by the heat treatment. The aluminum oxide film, which is a metal oxide insulating film, can be used as an insulating film.

The aluminum oxide film which is provided as the film 150 including the metal element over the oxide semiconductor film 144 has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor film 144 and release of oxygen, which is a main constituent material of the oxide semiconductor, from the oxide semiconductor film 144.

The film 150 including the metal element may be removed or another insulating film may be stacked over the film 150 including the metal element.

As the insulating film, a silicon oxide film, a silicon nitride film, a silicon oxynitride film, a silicon nitride oxide film, an aluminum nitride film, an aluminum oxide film, an aluminum oxynitride film, an aluminum nitride oxide film, a hafnium oxide film, and a gallium oxide film formed by a plasma-enhanced CVD method, a sputtering method, or the like.

Over the film 150 including the metal element, an electrode layer 153 is formed in a region which overlaps with the source or drain electrode 142a.

Next, an insulating film 152 is formed over the transistor 162 and the film 150 including the metal element. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide.

Next, an opening reaching the source or drain electrode 142b is formed in the gate insulating film 146, the film 150 including the metal element, and the insulating film 152. The opening is formed by selective etching with the use of a mask or the like.

After that, a wiring 156 is formed in the opening to be in contact with the source or drain electrode 142b. A connection point of the source or drain electrode 142b and the wiring 156 is not illustrated in FIGS. 12A to 12C.

The wiring 156 is formed in such a manner that a conductive layer is formed by a PVD method such as a sputtering method or a CVD method such as a plasma-enhanced CVD method and then the conductive layer is etched. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are the same as the details of the source electrode or drain electrode 142a.

Through the above process, the transistor 162 and the capacitor 164 are completed. The transistor 162 includes the oxide semiconductor film 144 which is highly purified and contains excess oxygen that repairs an oxygen vacancy. Therefore, the transistor 162 has less change in electric characteristics and is thus electrically stable. The capacitor 164 includes the source or drain electrode 142a and the electrode layer 153.

The oxide semiconductor film 144 and the gate insulating film 146 are stacked in the capacitor 164 in FIGS. 12A to 12C, whereby the insulation between the source or drain electrode 142a and the electrode layer 153 can be sufficiently provided. It is needless to say that the capacitor 164 without the oxide semiconductor film 144 may be employed in order to secure sufficient capacitance. The capacitor 164 may have a structure including an insulating film. Further alternatively, the capacitor 164 may be omitted in the case where a capacitor is not requisite.

FIG. 12C is an example of a diagram of a circuit using the semiconductor device as a memory element. In FIG. 12C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140. A second wiring (2nd Line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to a gate electrode of the transistor 162. A fifth wiring (5th Line, also referred to as a word line) and the other electrode of the capacitor 164 are electrically connected to each other.

The transistor 162 using an oxide semiconductor has extremely small off-state current; therefore, by turning the transistor 162 off, the potential of a node (hereinafter, a node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

To store data in the semiconductor device (in writing of data), the potential of the fourth wiring is set to a potential at which the transistor 162 is turned on, whereby the transistor 162 is turned on. Thus, the potential of the third wiring is supplied to the node FG, so that a predetermined amount of charge is accumulated in the node FG. Here, charge for supplying either of two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is kept being held in the node FG. The predetermined amount of charge is thus accumulated and held in the node FG, whereby the memory cell can store data.

Since the off-state current of the transistor 162 is extremely small, the charge supplied to the node FG is kept being held for a long period. Thus, the refresh operation is not requisite or the frequency of the refresh operation can be extremely reduced, which leads to a sufficient reduction in power consumption. Further, stored data can be kept being held for a long time even when power is not supplied.

To read out stored data (in reading of data), while a predetermined potential (a fixed potential) is supplied to the first wiring, an appropriate potential (a read-out potential) is supplied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is smaller than an apparent threshold value $V_{th\_L}$ of the transistor 140 in the case where the low-level charge is held in the node FG. Here, each apparent threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level electric charge is given in data writing, when the potential of the fifth wiring is $V_0$ ($>V_{th\_H}$), the transistor 140 is turned on. In the case where the low-level electric charge is given in writing, even when the potential of the fifth wiring is $V_0$ ($<V_{th\_L}$), the transistor 140 remains in an off state. Therefore, by controlling the potential of the fifth wiring and determining whether the transistor 140 is in an on state or off state (reading out the potential of the second wiring), stored data can be read out.

Further, in order to rewrite stored data, the next potential is supplied to the node FG that is holding the predetermined amount of charge given in the above data writing, so that the charge of the next data is held in the node FG. Specifically, the potential of the fourth wiring is set to a potential at which the transistor 162 is turned on, whereby the transistor 162 is turned on. The potential of the third wiring (potential of the next data) is supplied to the node FG, and the predetermined amount of charge is accumulated in the node FG. After that, the potential of the fourth wiring is set to a potential at which the transistor 162 is turned off, whereby the transistor 162 is turned off, whereby the charge of the next data is kept being held in the node FG. In other words, while the predetermined amount of charge given in the first writing is kept being held in the node FG, an operation (second writing) is performed in the same manner as the first writing, whereby data can be overwritten to be stored.

The off-state current of the transistor 162 described in this embodiment can be sufficiently reduced by using the oxide semiconductor film which is highly purified and contains excess oxygen, which is disclosed in this specification, as the oxide semiconductor film 144. Then, by using such a transistor, a semiconductor device in which stored data can be kept being held for an extremely long time can be provided.

As described above, in the transistor including an oxide semiconductor film including low-resistance regions between which a channel formation region is provided in the channel length direction, the off-state current is small and the on-state characteristics (e.g., on-state current and field-effect mobility) are high, which enables high-speed operation and high-speed response of the transistor. Further, the transistor can be miniaturized. Accordingly, by using the transistor, a high-performance, highly reliable semiconductor device can be provided.

The structures, methods, and the like described in this embodiment can be combined as appropriate with any of the structures, methods, and the like described in the other embodiments.

Embodiment 10

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 13A:
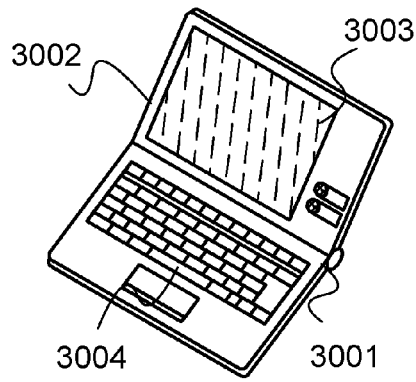
FIGS. 13A to 13F illustrate electronic devices.

FIG. 13A illustrates a laptop personal computer, which includes a main body 3001, a housing 3002, a display portion 3003, a keyboard 3004, and the like. The semiconductor device described in any of Embodiments 1 to 9 is applied to the display portion 3003, whereby a high-performance, highly reliable laptop personal computer can be provided.

Figure 13B:
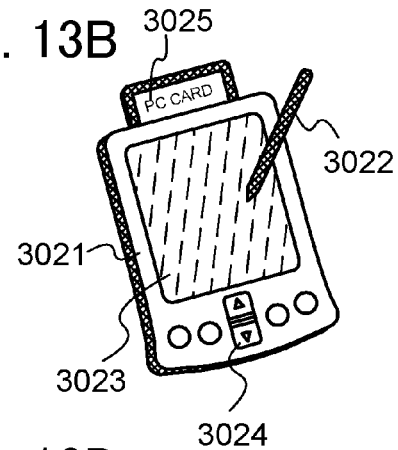

FIG. 13B is a personal digital assistant (PDA) including a display portion 3023, an external interface 3025, an operation button 3024, and the like provided for a main body 3021. A stylus 3022 is included as an accessory for operation. The semiconductor device described in any of Embodiments 1 to 9 is applied to the display portion 3023, whereby a high-performance, highly reliable personal digital assistant (PDA) can be provided.

Figure 13C:
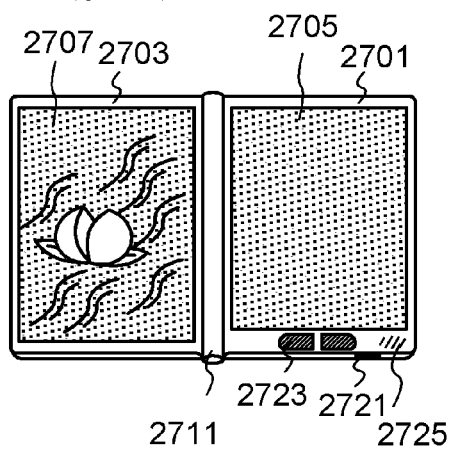

FIG. 13C illustrates an example of an e-book reader. For example, the e-book reader includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display images which constitute one screen or plural screens. In the case where the display portion 2705 and the display portion 2707 display images which constitute plural screens, for example, text can be displayed on display portion on the right side (the display portion 2705 in FIG. 13C) and an image/images can be displayed on a display portion on the left side (the display portion 2707 in FIG. 13C). The semiconductor device described in any of Embodiments 1 to 9 is applied to each of the display portion 2705 and the display portion 2707, whereby a high-performance, highly reliable e-book reader can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 13C illustrates an example in which the housing 2701 includes an operation portion and the like. For example, the housing 2701 is provided with a power switch 2721, an operation key 2723, a speaker 2725, and the like. With the operation key 2723, pages can be turned. A keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may be configured to transmit and receive data wirelessly. Through wireless communication, desired book data or the like can be purchased and downloaded from an e-book server.

Figure 13D:
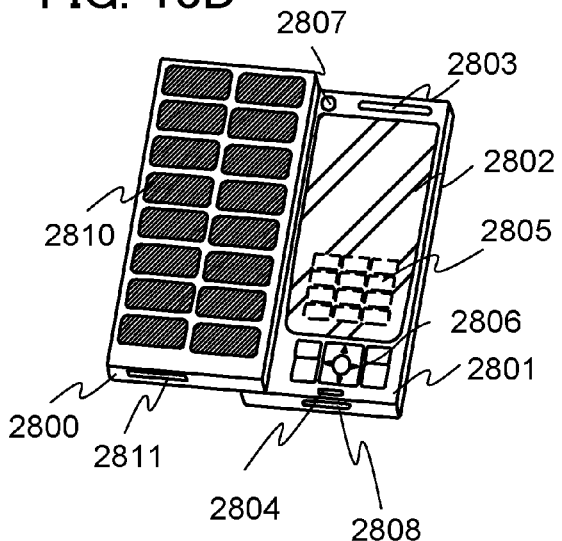

FIG. 13D is a mobile phone, which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with a solar cell 2810 for charging the mobile phone, an external memory slot 2811, and the like. Further, an antenna is incorporated in the housing 2801. The semiconductor device described in any of Embodiments 1 to 9 is applied to the display panel 2802, whereby a high-performance, highly reliable mobile phone can be provided.

Further, the display panel 2802 is provided with a touch panel. A plurality of operation keys 2805 which are displayed as images are indicated by dashed lines in FIG. 13D. A boosting circuit by which a voltage output from the solar cell 2810 is increased to be high requisite for each circuit is also provided.

In the display panel 2802, the display direction can be appropriately changed depending on a usage pattern. Further, since the display device is provided with the camera lens 2807 on the same surface as the display panel 2802, a videophone call can be performed. The speaker 2803 and the microphone 2804 can be used for videophone calls, recording and playing sound, and the like as well as voice calls. Furthermore, the housings 2800 and 2801 which are developed as illustrated in FIG. 13D can overlap with each other by sliding; thus, the size of the mobile phone can be decreased to be suitable for being carried.

The external connection terminal 2808 can be connected to an AC adapter and various types of cables such as a USB cable, and charging and data communication with a personal computer are possible. Moreover, a large amount of data can be stored and moved by a storage medium inserted into the external memory slot 2811.

Further, in addition to the above functions, an infrared communication function, a television reception function, or the like may be provided.

Figure 13E:
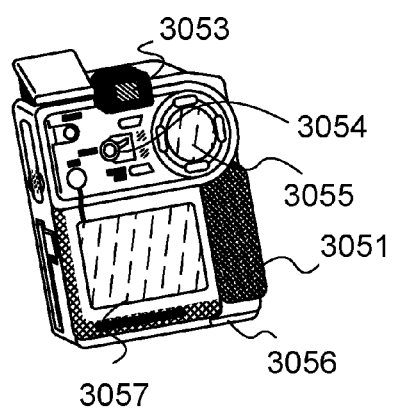

FIG. 13E illustrates a digital video camera which includes a main body 3051, a display portion A 3057, an eyepiece 3053, an operation switch 3054, a display portion B 3055, a battery 3056, and the like. The semiconductor device described in any of Embodiments 1 to 9 is applied to the display portion A 3057 and the display portion B 3055, whereby a high-performance, highly reliable digital video camera can be provided.

Figure 13F:
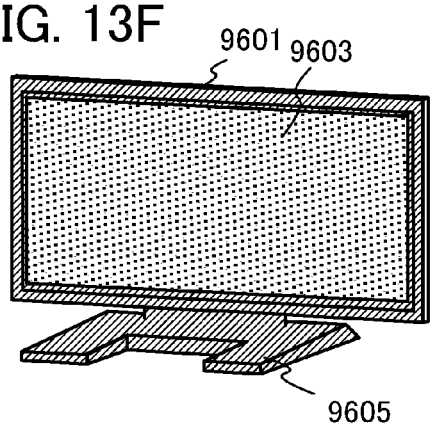

FIG. 13F illustrates an example of a television set. In the television set, a display portion 9603 is incorporated in a housing 9601. Images can be displayed on the display portion 9603. In this structure, the housing 9601 is supported by a stand 9605. The semiconductor device described in any of Embodiments 1 to 9 is applied to the display portion 9603, whereby a high-performance, highly reliable television set can be provided.

The television set can be operated by an operation switch of the housing 9601 or a separate remote controller. Further, the remote controller may be provided with a display portion for displaying data output from the remote controller.

The television set is provided with a receiver, a modem, and the like. With the use of the receiver, general television broadcasting can be received. Moreover, the television set can be connected to a communication network with or without wires via the modem, whereby one-way (from sender to receiver) or two-way (between sender and receiver or between receivers) data communication can be performed.

This embodiment can be implemented combining with any structure described in any other embodiment as appropriate.

This application is based on Japanese Patent Application serial no. 2011-129976 filed with Japan Patent Office on Jun. 10, 2011, the entire contents of which are hereby incorporated by reference.

What is claimed is:

1. A method for manufacturing a semiconductor device, comprising the steps of:
    forming a gate electrode layer over an oxide semiconductor film with a gate insulating film therebetween;
    introducing argon into portions of the oxide semiconductor film by ion implantation or ion doping using at least the gate electrode layer as a mask;
    forming a titanium nitride film over the gate electrode layer so as to contact the oxide semiconductor film; and heating the titanium nitride film to form low-resistance regions in the oxide semiconductor film, wherein the low-resistance regions contain argon and titanium.

2. The method according to claim 1, wherein the argon is introduced into the portions of the oxide semiconductor film through the titanium nitride film.

3. The method according to claim 1, wherein the oxide semiconductor film comprises indium.

4. The method according to claim 1, wherein the oxide semiconductor film comprises indium, gallium and zinc.

5. The method according to claim 1, wherein the argon is introduced by ion implantation.

6. A method for manufacturing a semiconductor device, comprising the steps of:

forming a gate electrode layer over an oxide semiconductor film with a gate insulating film therebetween;

introducing argon into portions of the oxide semiconductor film by ion implantation or ion doping using at least the gate electrode layer as a mask;

forming side wall insulators on side surfaces of the gate electrode layer;

forming a titanium nitride film over the gate electrode layer and the side wall insulators so as to contact the oxide semiconductor film; and heating the titanium nitride film to form low-resistance regions in the oxide semiconductor film, wherein the low-resistance regions contain argon and titanium.

7. The method according to claim 6, wherein the argon is introduced into the portions of the oxide semiconductor film through the titanium nitride film.

8. The method according to claim 6, wherein the oxide semiconductor film comprises indium.

9. The method according to claim 6, wherein the oxide semiconductor film comprises indium, gallium and zinc.

10. The method according to claim 6, wherein the argon is introduced before forming the side wall insulators.

11. The method according to claim 6, wherein the argon is introduced after forming the side wall insulators.

* * * * *